(12) United States Patent
Cheng et al.

(10) Patent No.: US 10,529,697 B2
(45) Date of Patent: Jan. 7, 2020

(54) PACKAGE STRUCTURE AND METHOD OF FORMING THE SAME

(71) Applicant: Taiwan Semiconductor Manufacturing Company, Ltd., Hsin-Chu (TW)

(72) Inventors: Hsi-Kuei Cheng, Zhubei (TW); Ching Fu Chang, Taipei (TW); Chih-Kang Han, Hsin-Chu (TW); Hsin-Chieh Huang, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 42 days.

(21) Appl. No.: 15/366,996

(22) Filed: Dec. 1, 2016

(65) Prior Publication Data

US 2018/0082988 A1    Mar. 22, 2018

Related U.S. Application Data

(60) Provisional application No. 62/396,055, filed on Sep. 16, 2016.

(51) Int. Cl.
*H01L 21/00* (2006.01)
*H01L 23/48* (2006.01)
(Continued)

(52) U.S. Cl.
CPC .......... *H01L 25/105* (2013.01); *H01L 21/486* (2013.01); *H01L 21/561* (2013.01); *H01L 21/6835* (2013.01); *H01L 21/6836* (2013.01); *H01L 21/78* (2013.01); *H01L 23/49811* (2013.01); *H01L 23/5389* (2013.01); *H01L 25/065* (2013.01); *H01L 25/0652* (2013.01); *H01L 25/0657* (2013.01); *H01L 25/16* (2013.01); *H01L 25/50* (2013.01);
(Continued)

(58) Field of Classification Search
CPC ..... H01L 2224/73265; H01L 2924/181; H01L 2224/81; H01L 25/0657; H01L 21/563
See application file for complete search history.

(56) References Cited

U.S. PATENT DOCUMENTS 8,361,842 B2    1/2013   Yu et al.
8,680,647 B2    3/2014   Yu et al.
(Continued)

FOREIGN PATENT DOCUMENTS

KR    20140030014 A    3/2014
KR    20140053598 A    5/2014
(Continued)

*Primary Examiner* — Bradley Smith
*Assistant Examiner* — David J Goodwin
(74) *Attorney, Agent, or Firm* — Slater Matsil, LLP

(57) ABSTRACT

An embodiment is a structure including a first package including a first die, and a molding compound at least laterally encapsulating the first die, a second package bonded to the first package with a first set of conductive connectors, the second package comprising a second die, and an underfill between the first package and the second package and surrounding the first set of conductive connectors, the underfill having a first portion extending up along a sidewall of the second package, the first portion having a first sidewall, the first sidewall having a curved portion and a planar portion.

19 Claims, 28 Drawing Sheets

(51) Int. Cl.
  *H01L 25/10* (2006.01)
  *H01L 21/48* (2006.01)
  *H01L 21/56* (2006.01)
  *H01L 21/683* (2006.01)
  *H01L 21/78* (2006.01)
  *H01L 25/065* (2006.01)
  *H01L 25/16* (2006.01)
  *H01L 25/00* (2006.01)
  *H01L 23/498* (2006.01)
  *H01L 23/538* (2006.01)

(52) U.S. Cl.
  CPC .... *H01L 23/49816* (2013.01); *H01L 23/5383* (2013.01); *H01L 23/5384* (2013.01); *H01L 2221/68331* (2013.01); *H01L 2221/68359* (2013.01); *H01L 2224/48091* (2013.01); *H01L 2224/97* (2013.01); *H01L 2225/0651* (2013.01); *H01L 2225/0652* (2013.01); *H01L 2225/06524* (2013.01); *H01L 2225/06548* (2013.01); *H01L 2225/06555* (2013.01); *H01L 2225/06572* (2013.01); *H01L 2225/1041* (2013.01); *H01L 2225/1058* (2013.01); *H01L 2225/1076* (2013.01); *H01L 2924/15311* (2013.01); *H01L 2924/181* (2013.01)

(56) References Cited

U.S. PATENT DOCUMENTS

| 8,703,542 | B2 | 4/2014 | Lin et al. |
| 8,759,964 | B2 | 6/2014 | Pu et al. |
| 8,778,738 | B1 | 7/2014 | Lin et al. |
| 8,785,299 | B2 | 7/2014 | Mao et al. |
| 8,803,306 | B1 | 8/2014 | Yu et al. |
| 8,809,996 | B2 | 8/2014 | Chen et al. |
| 8,829,676 | B2 | 9/2014 | Yu et al. |
| 8,877,554 | B2 | 11/2014 | Tsai et al. |
| 9,245,773 | B2 | 1/2016 | Lin et al. |
| 2011/0037155 | A1 | 2/2011 | Pagaila |
| 2011/0075393 | A1* | 3/2011 | Chandrasekaran ... H01L 23/147 361/807 |
| 2011/0291288 | A1 | 12/2011 | Wu et al. |
| 2013/0026468 | A1 | 1/2013 | Yoshimuta et al. |
| 2013/0062760 | A1 | 3/2013 | Hung et al. |
| 2013/0062761 | A1 | 3/2013 | Lin et al. |
| 2013/0137216 | A1 | 5/2013 | Ito et al. |
| 2013/0168848 | A1 | 7/2013 | Lin et al. |
| 2013/0307140 | A1 | 11/2013 | Huang et al. |
| 2014/0061888 | A1 | 3/2014 | Lin et al. |
| 2014/0117506 | A1 | 5/2014 | Hong et al. |
| 2014/0203429 | A1 | 7/2014 | Yu et al. |
| 2014/0217597 | A1* | 8/2014 | Lin ............. H01L 24/19 257/773 |
| 2014/0225222 | A1 | 8/2014 | Yu et al. |
| 2014/0252646 | A1 | 9/2014 | Hung et al. |
| 2014/0264930 | A1 | 9/2014 | Yu et al. |
| 2015/0187723 | A1* | 7/2015 | Huang ............. H01L 23/3135 257/738 |
| 2015/0228580 | A1 | 8/2015 | Chen et al. |
| 2015/0243633 | A1 | 8/2015 | Chen |
| 2016/0027764 | A1 | 1/2016 | Kim et al. |
| 2016/0056057 | A1 | 2/2016 | Yu et al. |
| 2016/0056126 | A1* | 2/2016 | Yu ............. H01L 21/565 257/737 |

FOREIGN PATENT DOCUMENTS

| KR | 20150095551 A | 8/2015 |
| KR | 20160012589 A | 2/2016 |
| KR | 20160023529 A | 3/2016 |

\* cited by examiner

PACKAGE STRUCTURE AND METHOD OF FORMING THE SAME

PACKAGE STRUCTURE AND METHOD OF FORMING THE SAME

This application claims the benefit of U.S. Provisional Application No. 62/396,055, filed on Sep. 16, 2016, entitled "Package Structure and Method of Forming the Same," which patent applications are incorporated herein by reference.

BACKGROUND

The semiconductor industry has experienced rapid growth due to ongoing improvements in the integration density of a variety of electronic components (e.g., transistors, diodes, resistors, capacitors, etc.). For the most part, improvement in integration density has resulted from iterative reduction of minimum feature size, which allows more components to be integrated into a given area. As the demand for shrinking electronic devices has grown, a need for smaller and more creative packaging techniques of semiconductor dies has emerged. An example of such packaging systems is Package-on-Package (PoP) technology. In a PoP device, a top semiconductor package is stacked on top of a bottom semiconductor package to provide a high level of integration and component density. PoP technology generally enables production of semiconductor devices with enhanced functionalities and small footprints on a printed circuit board (PCB).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
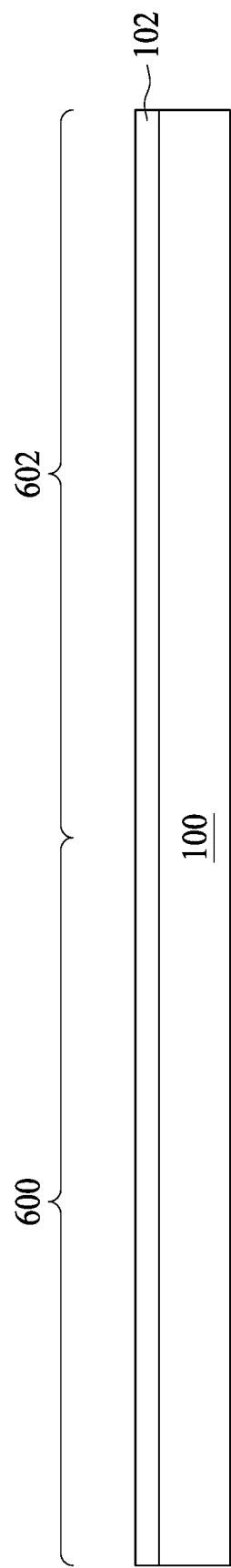
FIGS. 1 through 28 illustrate cross-sectional views of intermediate steps during a process for forming a package structure in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments discussed herein may be discussed in a specific context, namely a package structure including a full coverage underfill process that improves the protection of the sidewalls of the package that improves reliability and yield of the package structure. The disclosed full coverage underfill process also has increased underfill flowing speed and can simplify the package singulation process. The underfill may be cured under a higher pressure than other underfill processes. This increase in pressure may accelerate the movement of voids in the underfill during the curing process, which can increase throughput for the processing of packages. The package structures may include a fan-out or fan-in package and may include one or more redistribution layers (RDLs).

Further, the teachings of this disclosure are applicable to any package structure including an underfill process. Other embodiments contemplate other applications, such as different package types or different configurations that would be readily apparent to a person of ordinary skill in the art upon reading this disclosure. It should be noted that embodiments discussed herein may not necessarily illustrate every component or feature that may be present in a structure. For example, multiples of a component may be omitted from a figure, such as when discussion of one of the component may be sufficient to convey aspects of the embodiment. Further, method embodiments discussed herein may be discussed as being performed in a particular order; however, other method embodiments may be performed in any logical order.

FIGS. 1 through 28 illustrate cross-sectional views of intermediate steps during a process for forming a package structure in accordance with some embodiments. FIG. 1 illustrates a carrier substrate 100 and a release layer 102 formed on the carrier substrate 100. A first package region 600 and a second package region 602 for the formation of a first package and a second package, respectively, are illustrated.

The carrier substrate 100 may be a glass carrier substrate, a ceramic carrier substrate, or the like. The carrier substrate 100 may be a wafer, such that multiple packages can be formed on the carrier substrate 100 simultaneously. The release layer 102 may be formed of a polymer-based material, which may be removed along with the carrier substrate 100 from the overlying structures that will be formed in subsequent steps. In some embodiments, the release layer 102 is an epoxy-based thermal-release material, which loses its adhesive property when heated, such as a light-to-heat-conversion (LTHC) release coating. In other embodiments, the release layer 102 may be an ultra-violet (UV) glue, which loses its adhesive property when exposed to UV lights. The release layer 102 may be dispensed as a liquid and cured, may be a laminate film laminated onto the carrier substrate 100, or may be the like. The top surface of the release layer 102 may be leveled and may have a high degree of coplanarity.

Figure 2:
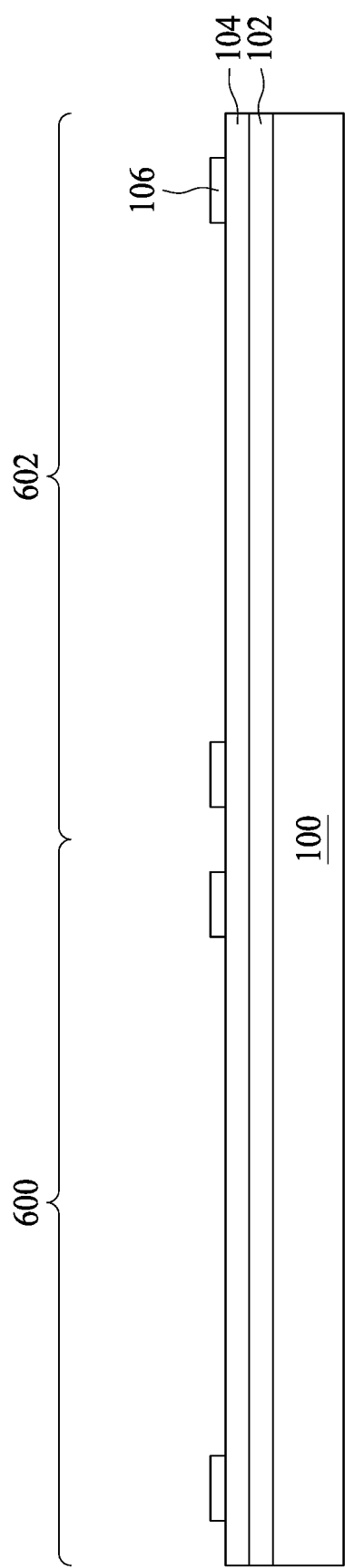

In FIG. 2, a dielectric layer 104 and a metallization pattern 106 are formed. As illustrated in FIG. 2, a dielectric layer 104 is formed on the release layer 102. The bottom surface of the dielectric layer 104 may be in contact with the top surface of the release layer 102. In some embodiments, the dielectric layer 104 is formed of a polymer, such as polybenzoxazole (PBO), polyimide, benzocyclobutene (BCB), or the like. In other embodiments, the dielectric layer 104 is formed of a nitride such as silicon nitride; an oxide such as silicon oxide, phosphosilicate glass (PSG), borosilicate glass (BSG), boron-doped phosphosilicate glass (BPSG), or the like; or the like. The dielectric layer 104 may be formed by any acceptable deposition process, such as spin coating, chemical vapor deposition (CVD), laminating, the like, or a combination thereof.

The metallization pattern 106 is formed on the dielectric layer 104. As an example to form metallization pattern 106, a seed layer (not shown) is formed over the dielectric layer 104. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photo resist is then formed and patterned on the seed layer. The photo resist may be formed by spin coating or the like and may be exposed to light for patterning. The pattern of the photo resist corresponds to the metallization pattern 106. The patterning forms openings through the photo resist to expose the seed layer. A conductive material is formed in the openings of the photo resist and on the exposed portions of the seed layer. The conductive material may be formed by plating, such as electroplating or electroless plating, or the like. The conductive material may comprise a metal, like copper, titanium, tungsten, aluminum, or the like. Then, the photo resist and portions of the seed layer on which the conductive material is not formed are removed. The photo resist may be removed by an acceptable ashing or stripping process, such as using an oxygen plasma or the like. Once the photo resist is removed, exposed portions of the seed layer are removed, such as by using an acceptable etching process, such as by wet or dry etching. The remaining portions of the seed layer and conductive material form the metallization pattern 106.

Figure 3:
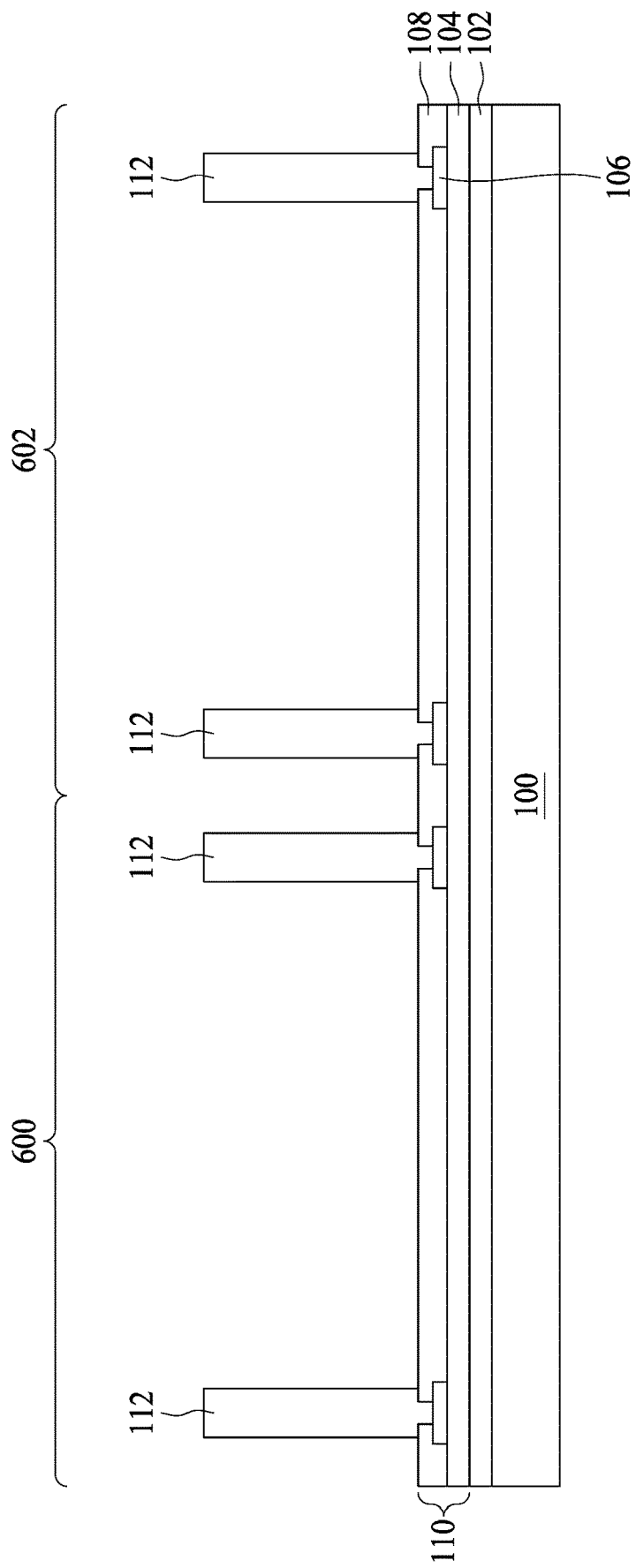

In FIG. 3, a dielectric layer 108 is formed on the metallization pattern 106 and the dielectric layer 104. In some embodiments, the dielectric layer 108 is formed of a polymer, which may be a photo-sensitive material such as PBO, polyimide, BCB, or the like, that may be patterned using a lithography mask. In other embodiments, the dielectric layer 108 is formed of a nitride such as silicon nitride; an oxide such as silicon oxide, PSG, BSG, BPSG; or the like. The dielectric layer 108 may be formed by spin coating, lamination, CVD, the like, or a combination thereof. The dielectric layer 108 is then patterned to form openings to expose portions of the metallization pattern 106. The patterning may be by an acceptable process, such as by exposing the dielectric layer 108 to light when the dielectric layer is a photo-sensitive material or by etching using, for example, an anisotropic etch.

The dielectric layers 104 and 108 and the metallization patterns 106 may be referred to as a back-side redistribution structure 110. As illustrated, the back-side redistribution structure 110 includes the two dielectric layers 104 and 108 and one metallization pattern 106. In other embodiments, the back-side redistribution structure 110 can include any number of dielectric layers, metallization patterns, and vias. One or more additional metallization pattern and dielectric layer may be formed in the back-side redistribution structure 110 by repeating the processes for forming a metallization patterns 106 and dielectric layer 108. Vias may be formed during the formation of a metallization pattern by forming the seed layer and conductive material of the metallization pattern in the opening of the underlying dielectric layer. The vias may therefore interconnect and electrically couple the various metallization patterns.

Further in FIG. 3, through vias 112 are formed. As an example to form the through vias 112, a seed layer is formed over the back-side redistribution structure 110, e.g., the dielectric layer 108 and the exposed portions of the metallization pattern 106 as illustrated. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photo resist is formed and patterned on the seed layer. The photo resist may be formed by spin coating or the like and may be exposed to light for patterning. The pattern of the photo resist corresponds to through vias. The patterning forms openings through the photo resist to expose the seed layer. A conductive material is formed in the openings of the photo resist and on the exposed portions of the seed layer. The conductive material may be formed by plating, such as electroplating or electroless plating, or the like. The conductive material may comprise a metal, like copper, titanium, tungsten, aluminum, or the like. The photo resist and portions of the seed layer on which the conductive material is not formed are removed. The photo resist may be removed by an acceptable ashing or stripping process, such as using an oxygen plasma or the like. Once the photo resist is removed, exposed portions of the seed layer are removed, such as by using an acceptable etching process, such as by wet or dry etching. The remaining portions of the seed layer and conductive material form through vias 112.

Figure 4:
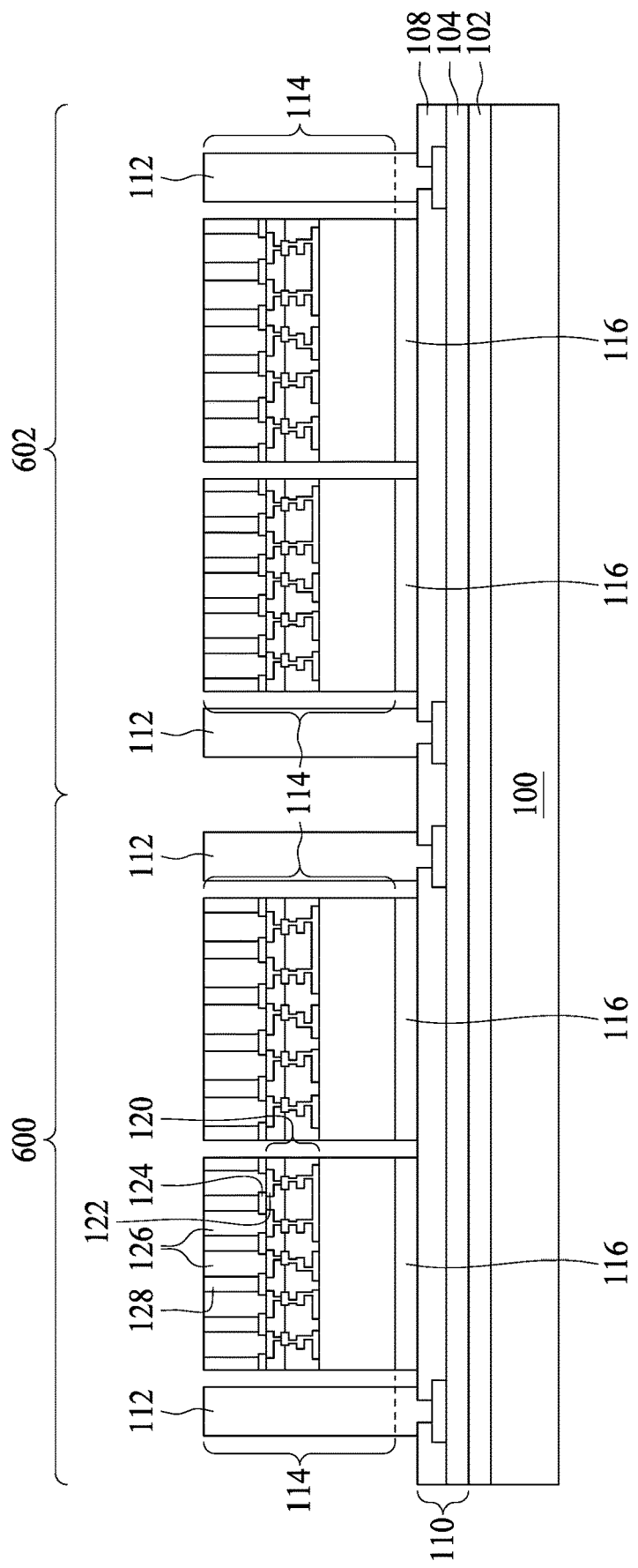

In FIG. 4, integrated circuit dies 114 are adhered to the dielectric layer 108 by an adhesive 116. As illustrated in FIG. 4, two integrated circuit dies 114 are adhered in each of the first package region 600 and the second package region 602, and in other embodiments, more or less integrated circuit dies 114 may be adhered in each region. The integrated circuit dies 114 may be logic dies (e.g., central processing unit, microcontroller, etc.), memory dies (e.g., dynamic random access memory (DRAM) die, static random access memory (SRAM) die, etc.), power management dies (e.g., power management integrated circuit (PMIC) die), radio frequency (RF) dies, sensor dies, micro-electro-mechanical-system (MEMS) dies, signal processing dies (e.g., digital signal processing (DSP) die), front-end dies (e.g., analog front-end (AFE) dies), the like, or a combination thereof. Also, in some embodiments, the integrated circuit dies 114 may be different sizes (e.g., different heights and/or surface areas), and in other embodiments, the integrated circuit dies 114 may be the same size (e.g., same heights and/or surface areas).

Before being adhered to the dielectric layer 108, the integrated circuit dies 114 may be processed according to applicable manufacturing processes to form integrated circuits in the integrated circuit dies 114. For example, the integrated circuit dies 114 each include a semiconductor substrate 118, such as silicon, doped or undoped, or an active layer of a semiconductor-on-insulator (SOI) substrate. The semiconductor substrate may include other semiconductor material, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. Devices, such as transistors, diodes, capacitors, resistors, etc., may be formed in and/or on the semiconductor substrate 118 and may be interconnected by interconnect structures 120 formed by, for example, metallization patterns in one or more dielectric layers on the semiconductor substrate 118 to form an integrated circuit.

The integrated circuit dies 114 further comprise pads 122, such as aluminum pads, to which external connections are made. The pads 122 are on what may be referred to as respective active sides of the integrated circuit dies 114. Passivation films 124 are on the integrated circuit dies 114 and on portions of the pads 122. Openings are through the passivation films 124 to the pads 122. Die connectors 126, such as conductive pillars (for example, comprising a metal such as copper), are in the openings through passivation films 124 and are mechanically and electrically coupled to the respective pads 122. The die connectors 126 may be formed by, for example, plating, or the like. The die connectors 126 electrically couple the respective integrated circuits of the integrate circuit dies 114.

A dielectric material 128 is on the active sides of the integrated circuit dies 114, such as on the passivation films 124 and the die connectors 126. The dielectric material 128 laterally encapsulates the die connectors 126, and the dielectric material 128 is laterally coterminous with the respective integrated circuit dies 114. The dielectric material 128 may be a polymer such as PBO, polyimide, BCB, or the like; a nitride such as silicon nitride or the like; an oxide such as silicon oxide, PSG, BSG, BPSG, or the like; the like, or a combination thereof, and may be formed, for example, by spin coating, lamination, CVD, or the like.

Adhesive 116 is on back-sides of the integrated circuit dies 114 and adheres the integrated circuit dies 114 to the back-side redistribution structure 110, such as the dielectric layer 108 in the illustration. The adhesive 116 may be any suitable adhesive, epoxy, die attach film (DAF), or the like. The adhesive 116 may be applied to a back-side of the integrated circuit dies 114, such as to a back-side of the respective semiconductor wafer or may be applied over the surface of the carrier substrate 100. The integrated circuit dies 114 may be singulated, such as by sawing or dicing, and adhered to the dielectric layer 108 by the adhesive 116 using, for example, a pick-and-place tool.

Figure 5:
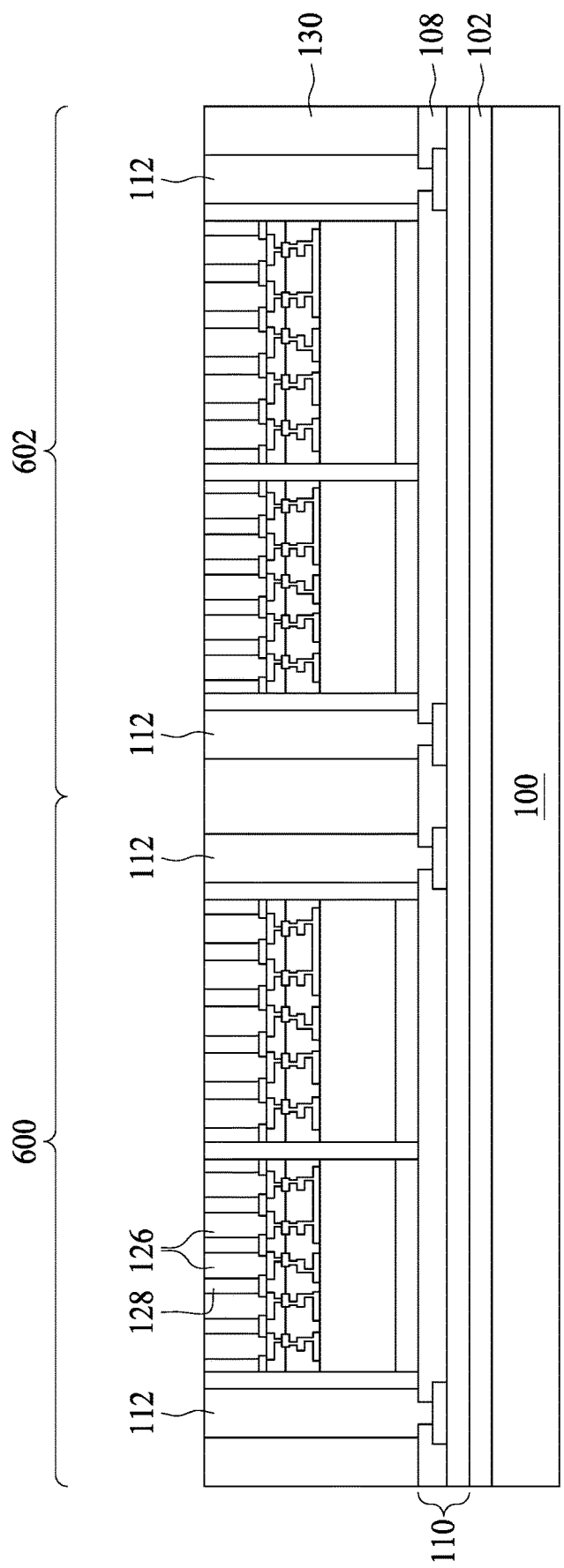

In FIG. 5, an encapsulant 130 is formed on the various components. The encapsulant 130 may be a molding compound, epoxy, or the like, and may be applied by compression molding, transfer molding, or the like. After curing, the encapsulant 130 can undergo a grinding process to expose the through vias 112 and die connectors 126. Top surfaces of the through vias 112, die connectors 126, and encapsulant 130 are coplanar after the grinding process. In some embodiments, the grinding may be omitted, for example, if through vias 112 and die connectors 126 are already exposed.

In FIGS. 6 through 16, a front-side redistribution structure 160 is formed. As will be illustrated in FIG. 16, the front-side redistribution structure 160 includes dielectric layers 132, 140, 148, and 156 and metallization patterns 138, 146, and 154.

Figure 6:
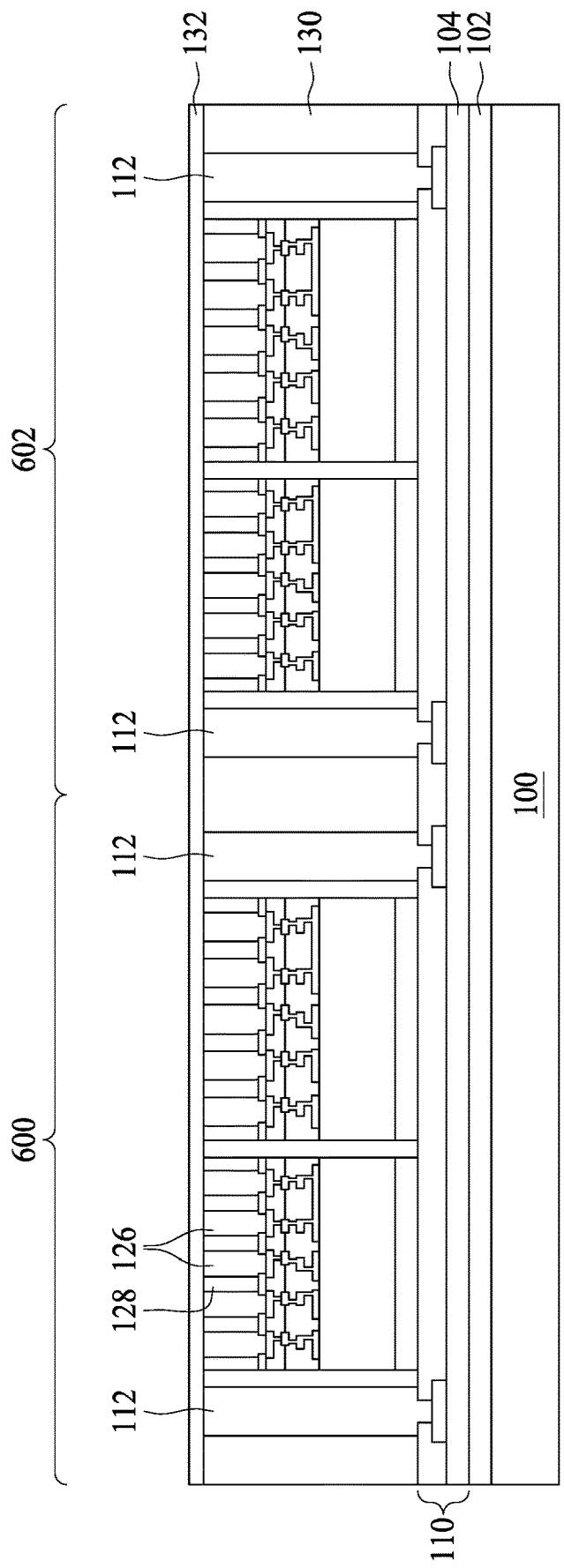

In FIG. 6, the dielectric layer 132 is deposited on the encapsulant 130, through vias 112, and die connectors 126. In some embodiments, the dielectric layer 132 is formed of a polymer, which may be a photo-sensitive material such as PBO, polyimide, BCB, or the like, that may be patterned using a lithography mask. In other embodiments, the dielectric layer 132 is formed of a nitride such as silicon nitride; an oxide such as silicon oxide, PSG, BSG, BPSG; or the like. The dielectric layer 132 may be formed by spin coating, lamination, CVD, the like, or a combination thereof.

Figure 7:
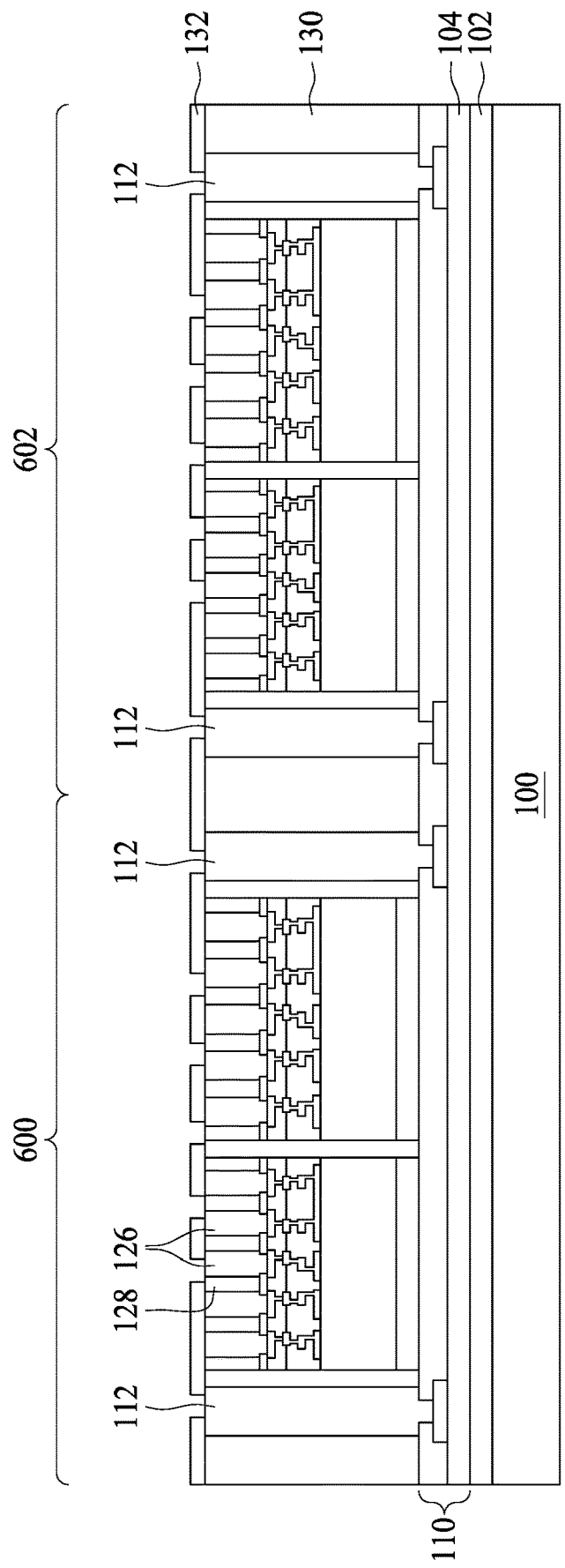

In FIG. 7, the dielectric layer 132 is then patterned. The patterning forms openings to expose portions of the through vias 112 and the die connectors 126. The patterning may be by an acceptable process, such as by exposing the dielectric layer 132 to light when the dielectric layer 132 is a photo-sensitive material or by etching using, for example, an anisotropic etch. If the dielectric layer 132 is a photo-sensitive material, the dielectric layer 132 can be developed after the exposure.

Figure 8:
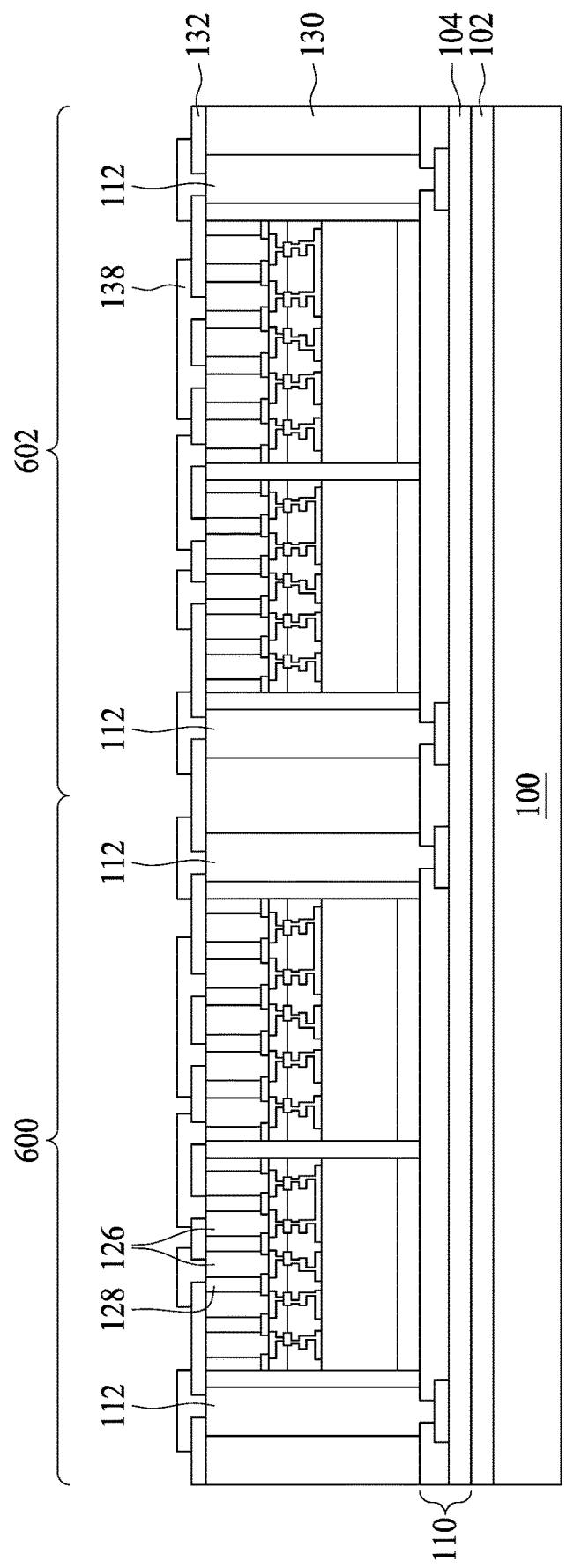

In FIG. 8, metallization pattern 138 with vias is formed on the dielectric layer 132. As an example to form metallization pattern 138, a seed layer (not shown) is formed over the dielectric layer 132 and in openings through the dielectric layer 132. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photo resist is then formed and patterned on the seed layer. The photo resist may be formed by spin coating or the like and may be exposed to light for patterning. The pattern of the photo resist corresponds to the metallization pattern 138. The patterning forms openings through the photo resist to expose the seed layer. A conductive material is formed in the openings of the photo resist and on the exposed portions of the seed layer. The conductive material may be formed by plating, such as electroplating or electroless plating, or the like. The conductive material may comprise a metal, like copper, titanium, tungsten, aluminum, or the like. Then, the photo resist and portions of the seed layer on which the conductive material is not formed are removed. The photo resist may be removed by an acceptable ashing or stripping process, such as using an oxygen plasma or the like. Once the photo resist is removed, exposed portions of the seed layer are removed, such as by using an acceptable etching process, such as by wet or dry etching. The remaining portions of the seed layer and conductive material form the metallization pattern 138 and vias. The vias are formed in openings through the dielectric layer 132 to, e.g., the through vias 112 and/or the die connectors 126.

Figure 9:
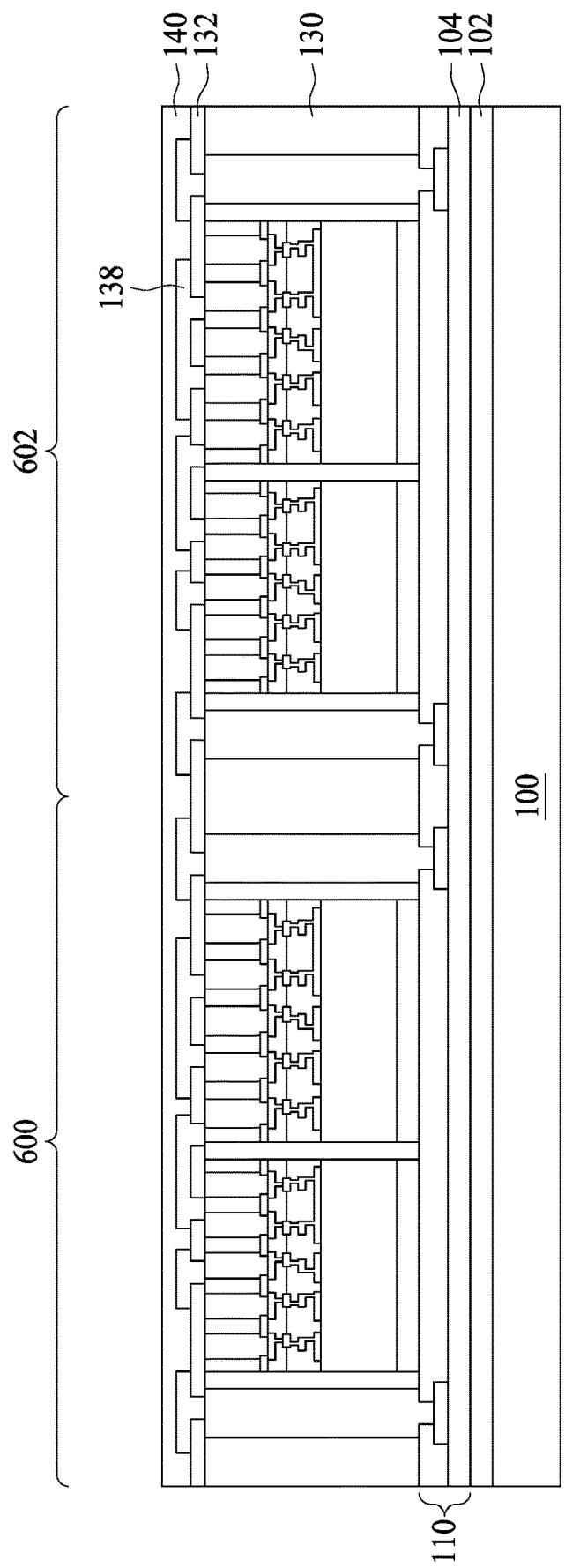

In FIG. 9, the dielectric layer 140 is deposited on the metallization pattern 138 and the dielectric layer 132. In some embodiments, the dielectric layer 140 is formed of a polymer, which may be a photo-sensitive material such as PBO, polyimide, BCB, or the like, that may be patterned using a lithography mask. In other embodiments, the dielectric layer 140 is formed of a nitride such as silicon nitride; an oxide such as silicon oxide, PSG, BSG, BPSG; or the like. The dielectric layer 140 may be formed by spin coating, lamination, CVD, the like, or a combination thereof.

Figure 10:
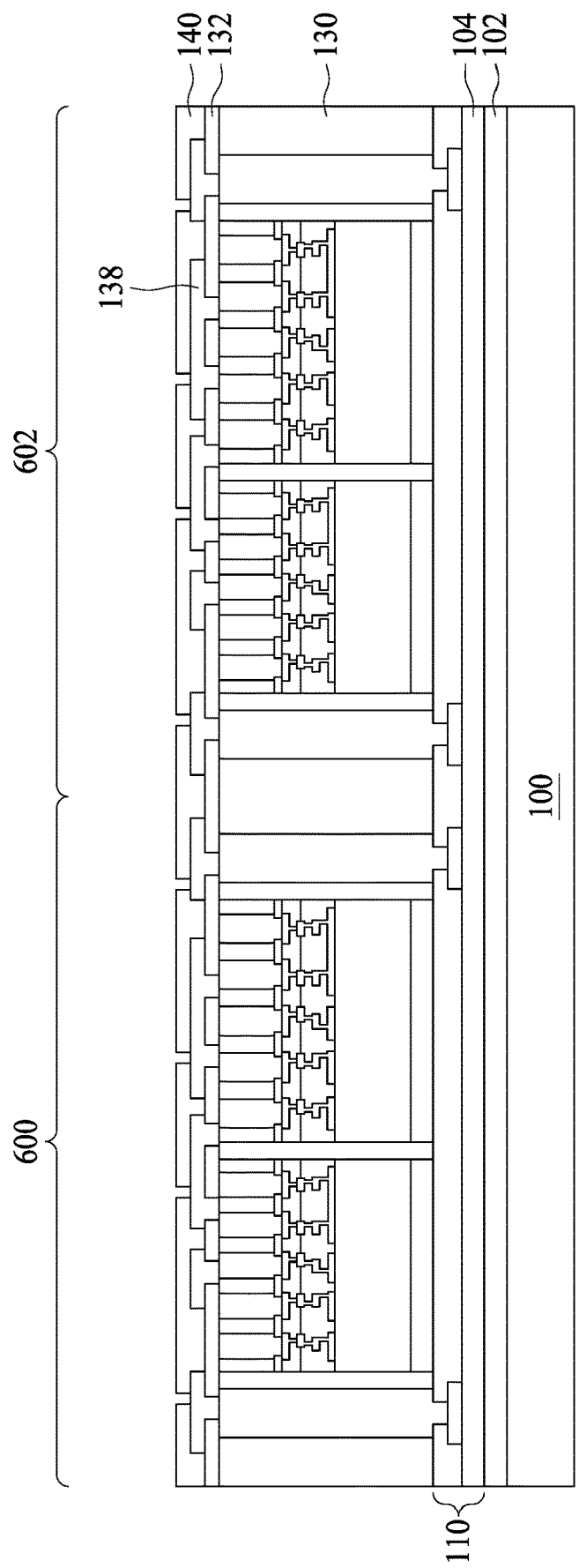

In FIG. 10, the dielectric layer 140 is then patterned. The patterning forms openings to expose portions of the metallization pattern 138. The patterning may be by an acceptable process, such as by exposing the dielectric layer 140 to light when the dielectric layer is a photo-sensitive material or by etching using, for example, an anisotropic etch. If the dielectric layer 140 is a photo-sensitive material, the dielectric layer 140 can be developed after the exposure.

Figure 11:
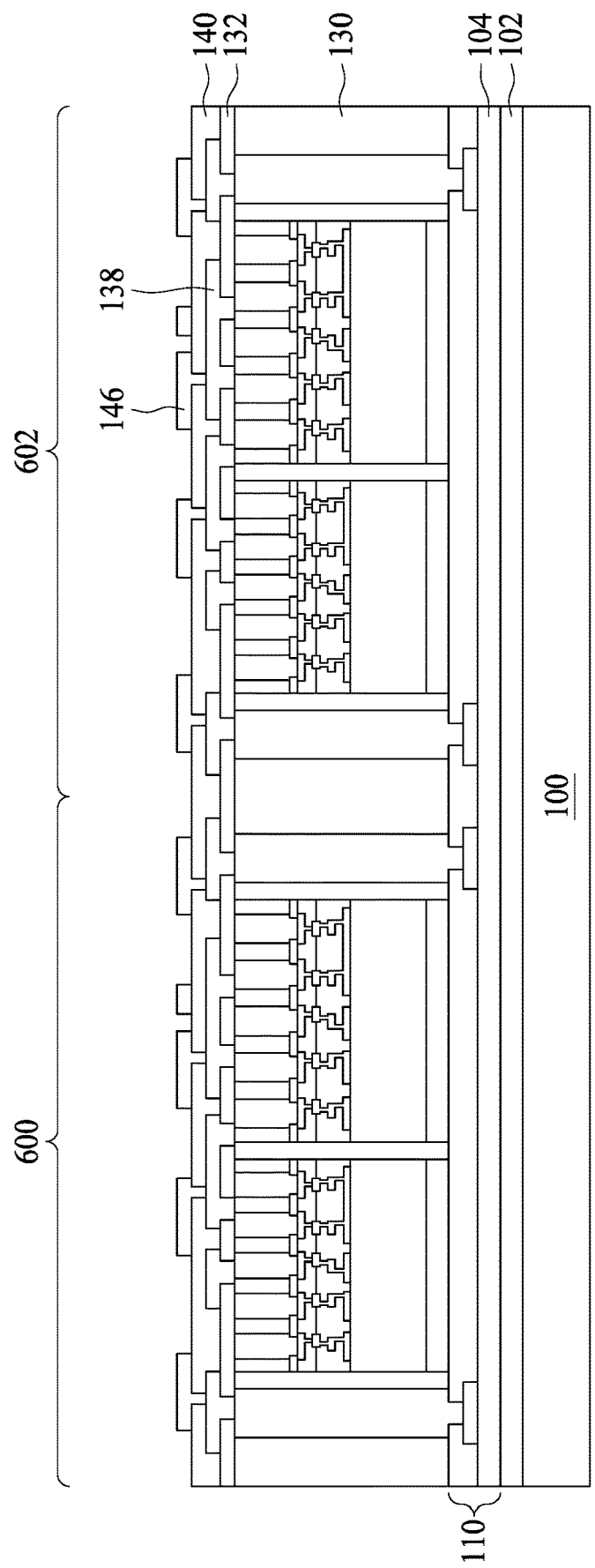

In FIG. 11, metallization pattern 146 with vias is formed on the dielectric layer 140. As an example to form metallization pattern 146, a seed layer (not shown) is formed over the dielectric layer 140 and in openings through the dielectric layer 140. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photo resist is then formed and patterned on the seed layer. The photo resist may be formed by spin coating or the like and may be exposed to light for patterning. The pattern of the photo resist corresponds to the metallization pattern 146. The patterning forms openings through the photo resist to expose the seed layer. A conductive material is formed in the openings of the photo resist and on the exposed portions of the seed layer. The conductive material may be formed by plating, such as electroplating or electroless plating, or the like. The conductive material may comprise a metal, like copper, titanium, tungsten, aluminum, or the like. Then, the photo resist and portions of the seed layer on which the conductive material is not formed are removed. The photo resist may be removed by an acceptable ashing or stripping process, such as using an oxygen plasma or the like. Once the photo resist is removed, exposed portions of the seed layer are removed, such as by using an acceptable etching process, such as by wet or dry etching. The remaining portions of the seed layer and conductive material form the metallization pattern 146 and vias. The vias are formed in openings through the dielectric layer 140 to, e.g., portions of the metallization pattern 138.

Figure 12:
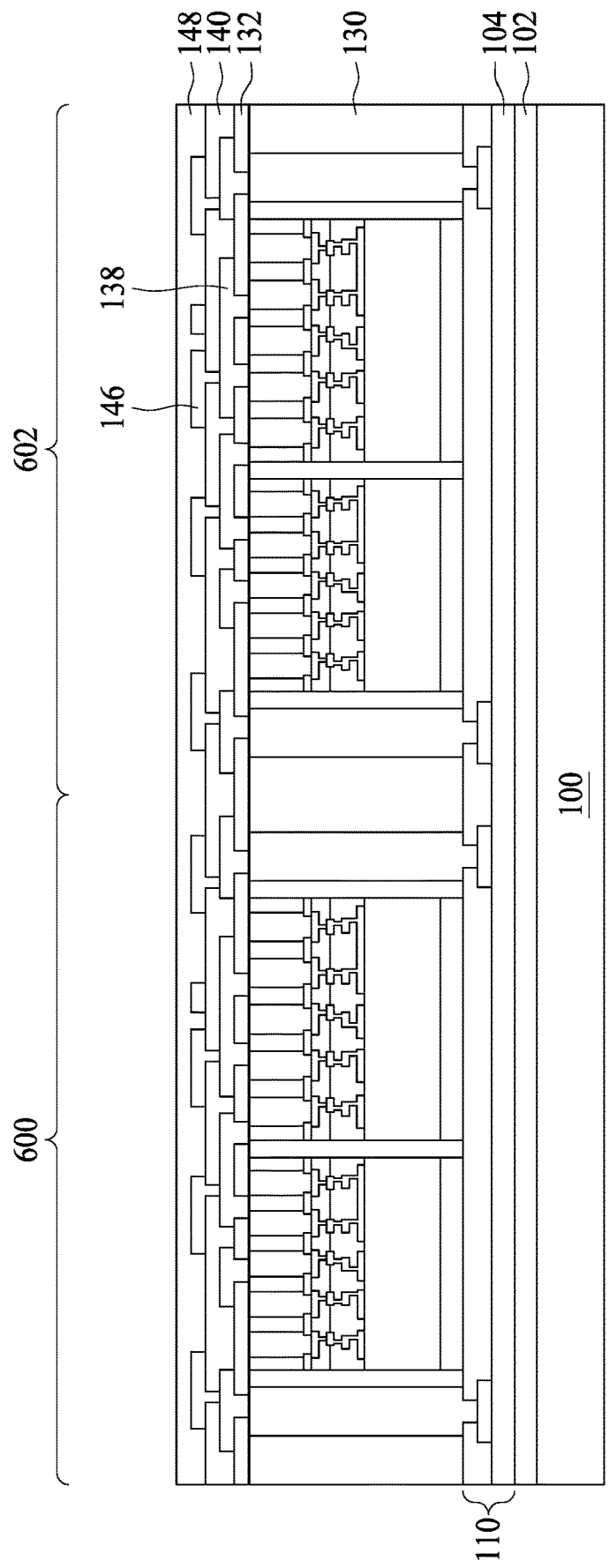

In FIG. 12, the dielectric layer 148 is deposited on the metallization pattern 146 and the dielectric layer 140. In some embodiments, the dielectric layer 148 is formed of a polymer, which may be a photo-sensitive material such as PBO, polyimide, BCB, or the like, that may be patterned using a lithography mask. In other embodiments, the dielectric layer 148 is formed of a nitride such as silicon nitride; an oxide such as silicon oxide, PSG, BSG, BPSG; or the like. The dielectric layer 148 may be formed by spin coating, lamination, CVD, the like, or a combination thereof.

Figure 13:
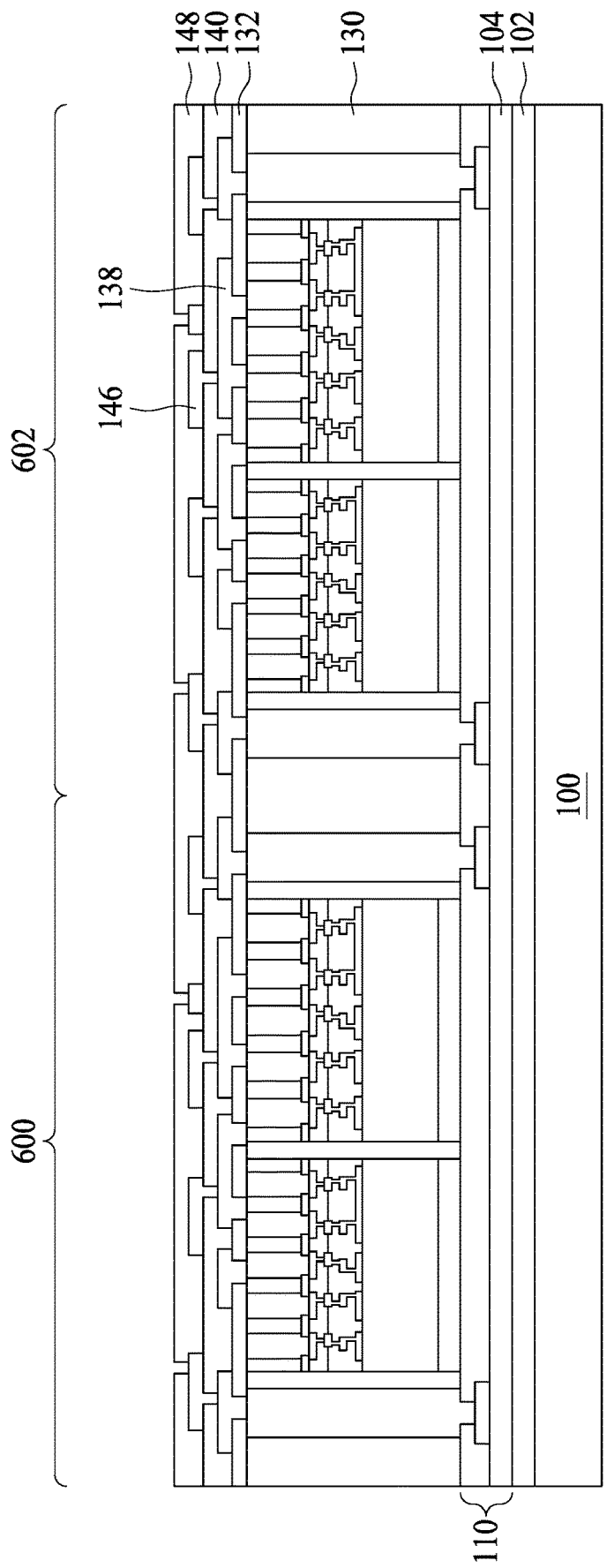

In FIG. 13, the dielectric layer 148 is then patterned. The patterning forms openings to expose portions of the metallization pattern 146. The patterning may be by an acceptable process, such as by exposing the dielectric layer 148 to light when the dielectric layer is a photo-sensitive material or by etching using, for example, an anisotropic etch. If the dielectric layer 148 is a photo-sensitive material, the dielectric layer 148 can be developed after the exposure.

Figure 14:
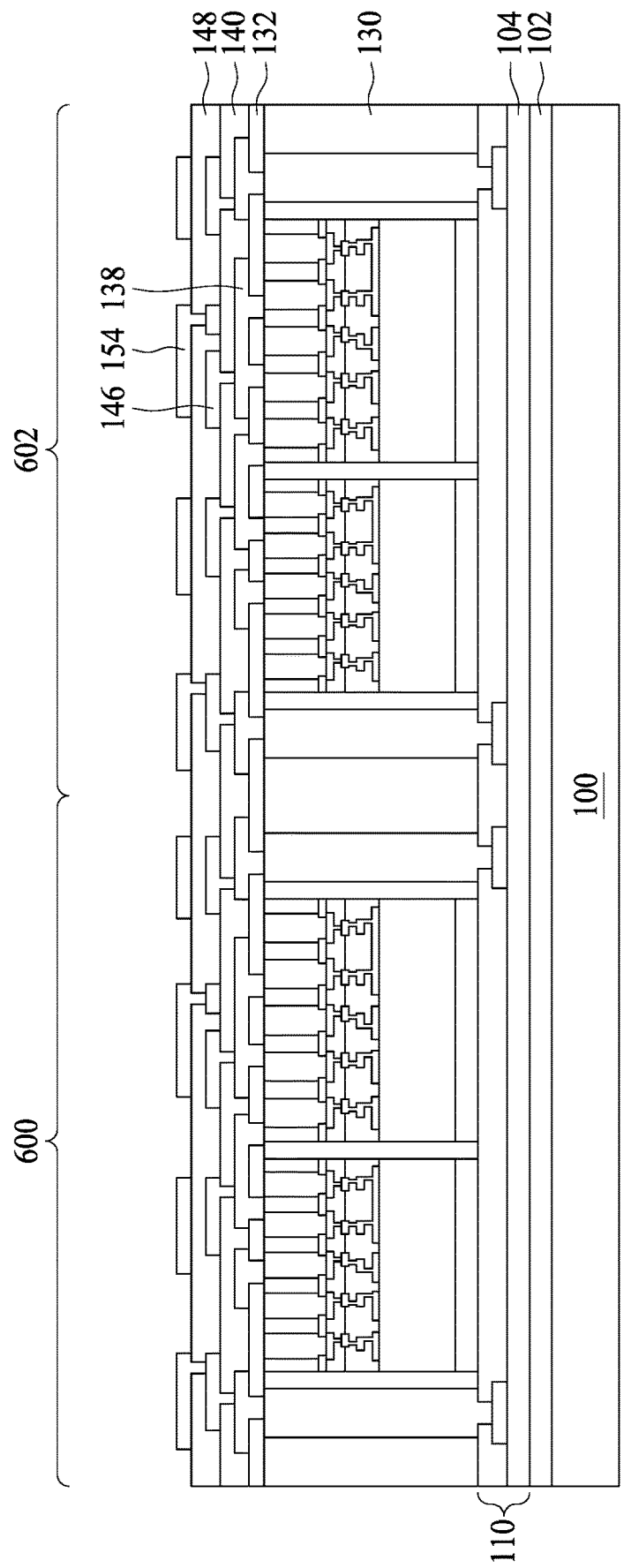

In FIG. 14, metallization pattern 154 with vias is formed on the dielectric layer 148. As an example to form metallization pattern 154, a seed layer (not shown) is formed over the dielectric layer 148 and in openings through the dielectric layer 148. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photo resist is then formed and patterned on the seed layer. The photo resist may be formed by spin coating or the like and may be exposed to light for patterning. The pattern of the photo resist corresponds to the metallization pattern 154. The patterning forms openings through the photo resist to expose the seed layer. A conductive material is formed in the openings of the photo resist and on the exposed portions of the seed layer. The conductive material may be formed by plating, such as electroplating or electroless plating, or the like. The conductive material may comprise a metal, like copper, titanium, tungsten, aluminum, or the like. Then, the photo resist and portions of the seed layer on which the conductive material is not formed are removed. The photo resist may be removed by an acceptable ashing or stripping process, such as using an oxygen plasma or the like. Once the photo resist is removed, exposed portions of the seed layer are removed, such as by using an acceptable etching process, such as by wet or dry etching. The remaining portions of the seed layer and conductive material form the metallization pattern 154 and vias. The vias are formed in openings through the dielectric layer 148 to, e.g., portions of the metallization pattern 146.

Figure 15:
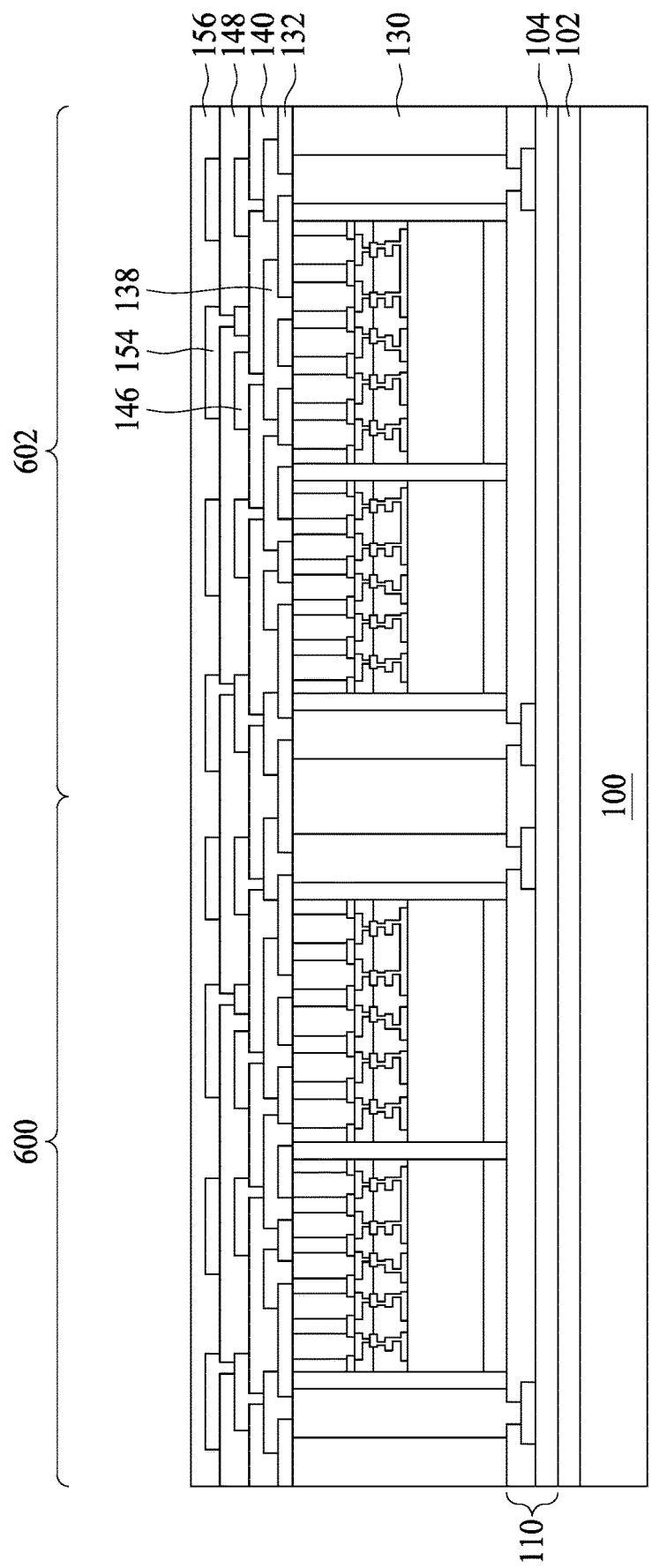

In FIG. 15, the dielectric layer 156 is deposited on the metallization pattern 154 and the dielectric layer 148. In some embodiments, the dielectric layer 156 is formed of a polymer, which may be a photo-sensitive material such as PBO, polyimide, BCB, or the like, that may be patterned using a lithography mask. In other embodiments, the dielectric layer 156 is formed of a nitride such as silicon nitride; an oxide such as silicon oxide, PSG, BSG, BPSG; or the like. The dielectric layer 156 may be formed by spin coating, lamination, CVD, the like, or a combination thereof.

Figure 16:
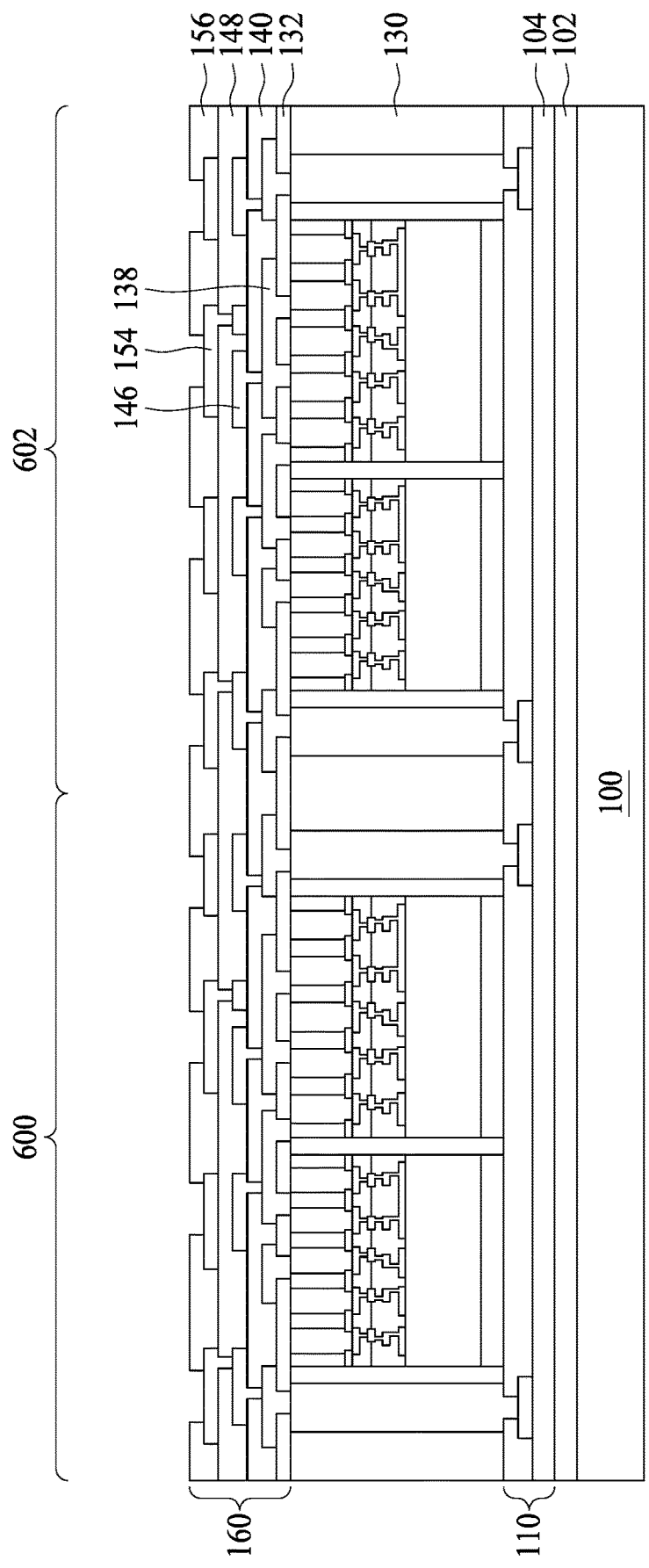

In FIG. 16, the dielectric layer 156 is then patterned. The patterning forms openings to expose portions of the metallization pattern 154 for the subsequent formation of pads 162. The patterning may be by an acceptable process, such as by exposing the dielectric layer 156 to light when the dielectric layer is a photo-sensitive material or by etching using, for example, an anisotropic etch. If the dielectric layer 156 is a photo-sensitive material, the dielectric layer 156 can be developed after the exposure.

The front-side redistribution structure 160 is shown as an example. More or fewer dielectric layers and metallization patterns may be formed in the front-side redistribution structure 160. If fewer dielectric layers and metallization patterns are to be formed, steps and process discussed above may be omitted. If more dielectric layers and metallization patterns are to be formed, steps and processes discussed above may be repeated. One having ordinary skill in the art will readily understand which steps and processes would be omitted or repeated.

Figure 17:
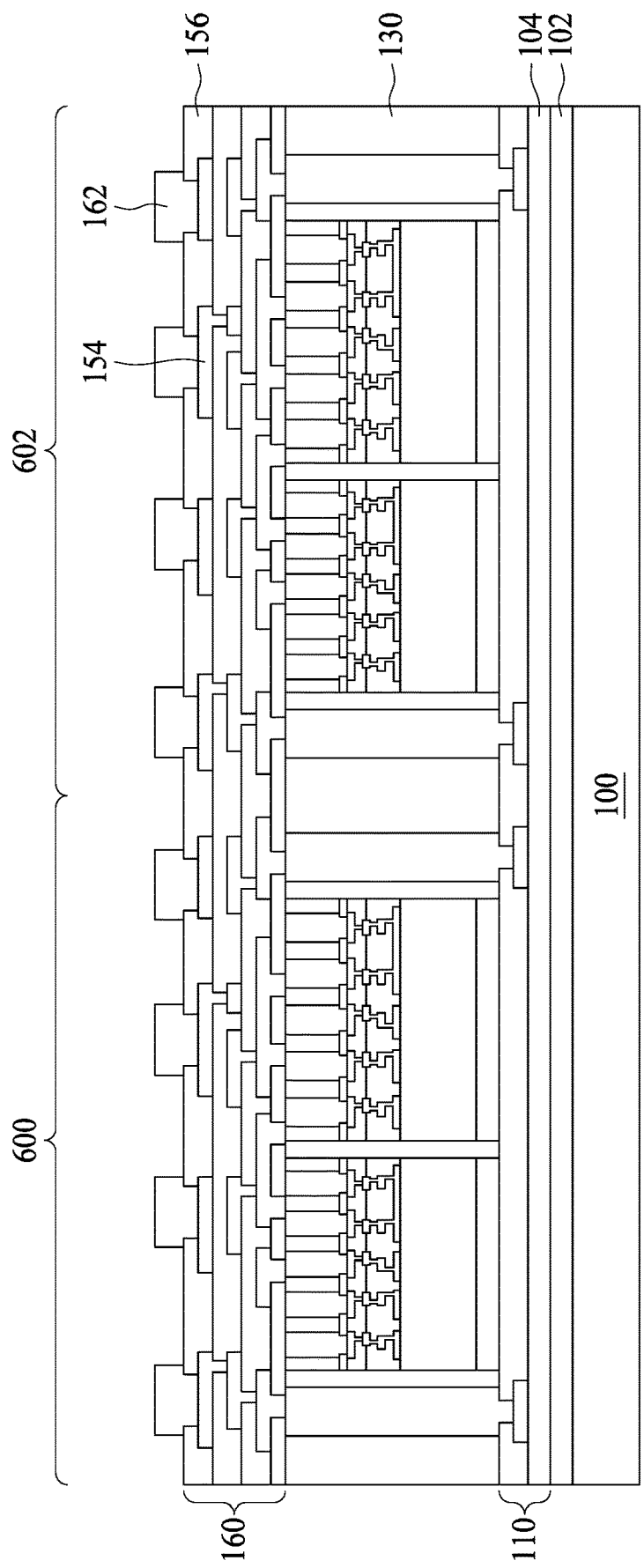

In FIG. 17, pads 162 are formed on an exterior side of the front-side redistribution structure 160. The pads 162 are used to couple to conductive connectors 166 and integrated passive devices 170 (see FIG. 18) and may be referred to as under bump metallurgies (UBMs) 162. In the illustrated embodiment, the pads 162 are formed through openings through the dielectric layer 156 to the metallization pattern 154. As an example to form the pads 162, a seed layer (not shown) is formed over the dielectric layer 156. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photo resist is then formed and patterned on the seed layer. The photo resist may be formed by spin coating or the like and may be exposed to light for patterning. The pattern of the photo resist corresponds to the pads 162. The patterning forms openings through the photo resist to expose the seed layer. A conductive material is formed in the openings of the photo resist and on the exposed portions of the seed layer. The conductive material may be formed by plating, such as electroplating or electroless plating, or the like. The conductive material may comprise a metal, like copper, titanium, tungsten, aluminum, or the like. Then, the photo resist and portions of the seed layer on which the conductive material is not formed are removed. The photo resist may be removed by an acceptable ashing or stripping process, such as using an oxygen plasma or the like. Once the photo resist is removed, exposed portions of the seed layer are removed, such as by using an acceptable etching process, such as by wet or dry etching. The remaining portions of the seed layer and conductive material form the pads 162. In the embodiment, where the pads 162 are formed differently, more photo resist and patterning steps may be utilized.

Figure 18:
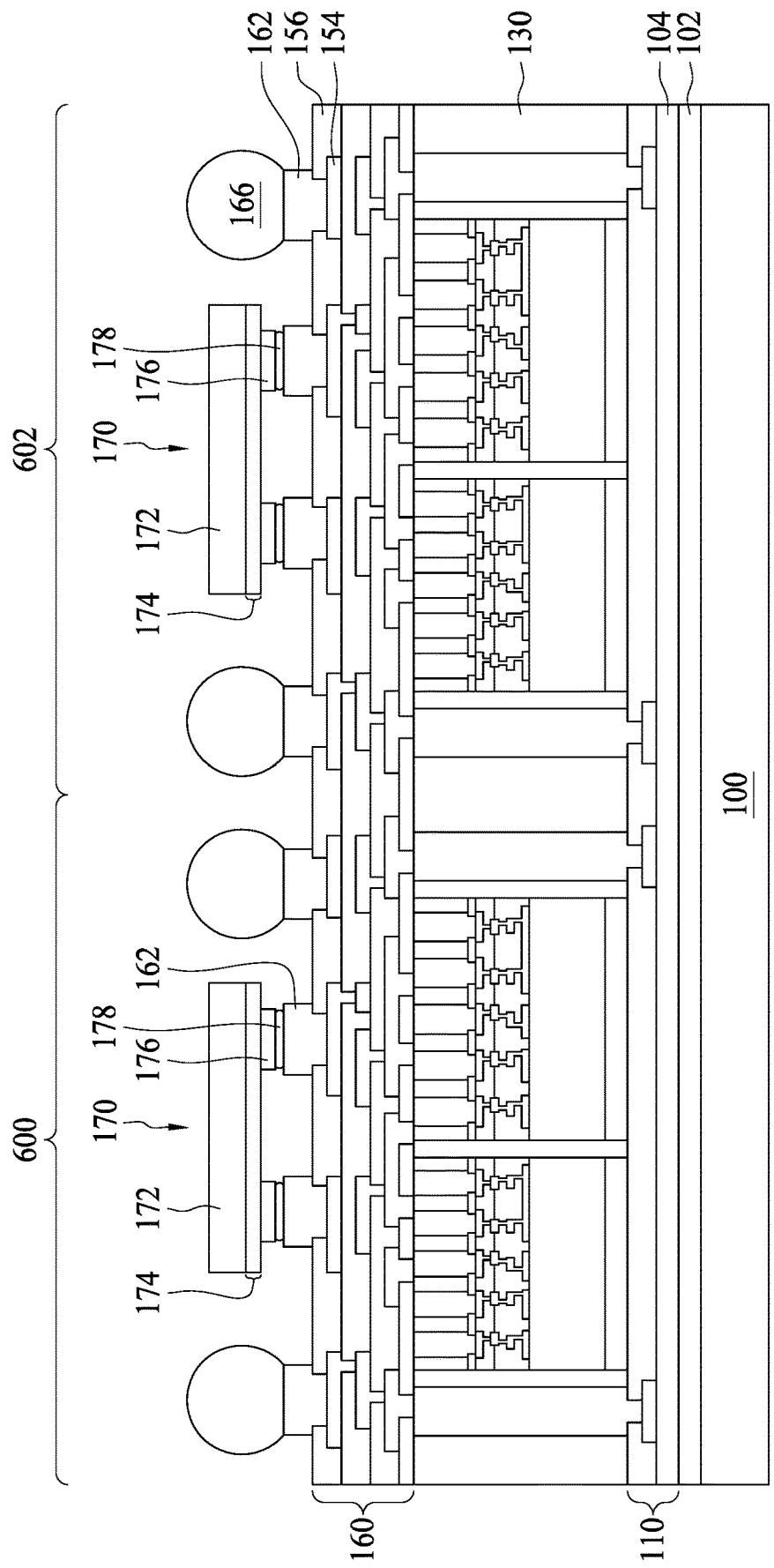

In FIG. 18, conductive connectors 166 are formed on the pads 162 and the IPD components 170 are bonded to the metallization pattern pads 162. The IPD components may be bonded to the UBMs 162 using micro bumps with a solder layer. In some embodiments the conductive connectors 166 may be mounted on the pads 162 before the IPD components are bonded and mounted to the pads 162. In some embodiments the conductive connectors 166 may be mounted on the pads 162 after the IPD components are bonded and mounted to the pads 162.

Before being bonded to the pads 162, the IPD components 170 may be processed according to applicable manufacturing processes to form passive devices in the IPD components 170. For example, the IPD components each comprise one or more passive devices in the main structure 172 of the IPD components 170. The main structure 172 could include a substrate and/or encapsulant. In the embodiments including a substrate, the substrate could be a semiconductor substrate, such as silicon, doped or undoped, or an active layer of a SOI substrate. The semiconductor substrate may include other semiconductor material, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. The passive devices may include a capacitor, resistor, inductor, the like, or a combination thereof. The passive devices may be formed in and/or on the semiconductor substrate and/or within the encapsulant and may be interconnected by interconnect structures 174 formed by, for example, metallization patterns in one or more dielectric layers on the main structure 172 to form an integrated passive device 170.

The IPD components 170 further comprise micro bumps 176 formed and coupled to the interconnect 174, to which external connections are made. The micro bumps 176 have a solder layer or bump 178 formed on an end of the micro bump 176 that forms a solder joint between the front-side redistribution structure 160 and the IPD components 170. In contrast to conventional solder balls such as those used in a ball grid array (BGA) connector (see conductive connectors 166), which may have a diameter ranging from, e.g., about 150 μm to about 300 μm, micro bumps 176 have much smaller diameters ranging from, e.g., about 10 μm to about 40 μm. The micro bumps 176 may, in some embodiments, have a pitch of about 40 μm or greater.

In some embodiments, the IPD components 170 cannot be forced onto the front-side redistribution structure 160 during the bonding process. In these embodiments, the bonding of the IPD components 170 may begin by positioning the IPD component 170 at the level of the conductive connectors 166 with, e.g., a pick-and-place tool. Next, the pick-and-place tool drops the IPD component 170 onto the openings 164 and the exposed metallization pattern 154 of the front-side redistribution structure 160. During a subsequent bonding process, the micro bumps 176 are bonded to metallization pattern 154 by, e.g., a reflow process, and as a result of the bonding process, solder joints are formed which electrically and mechanically connect the micro bumps 176 of the IPD component 170 with the pads 162 of the package. The small size of micro bumps 176 allows fine pitches between micro bump 176 and enables high-density connections.

The conductive connectors 166 may be BGA connectors, solder balls, metal pillars, controlled collapse chip connection (C4) bumps, micro bumps, electroless nickel-electroless palladium-immersion gold technique (ENEPIG) formed bumps, or the like. The conductive connectors 166 may include a conductive material such as solder, copper, aluminum, gold, nickel, silver, palladium, tin, the like, or a combination thereof. In some embodiments, the conductive connectors 166 are formed by initially forming a layer of solder through such commonly used methods such as evaporation, electroplating, printing, solder transfer, ball placement, or the like. Once a layer of solder has been formed on the structure, a reflow may be performed in order to shape the material into the desired bump shapes. In another embodiment, the conductive connectors 166 are metal pillars (such as a copper pillar) formed by a sputtering, printing, electro plating, electroless plating, CVD, or the like. The metal pillars may be solder free and have substantially vertical sidewalls. In some embodiments, a metal cap layer (not shown) is formed on the top of the metal pillar connectors 166. The metal cap layer may include nickel, tin, tin-lead, gold, silver, palladium, indium, nickel-palladium-gold, nickel-gold, the like, or a combination thereof and may be formed by a plating process.

Figure 19:
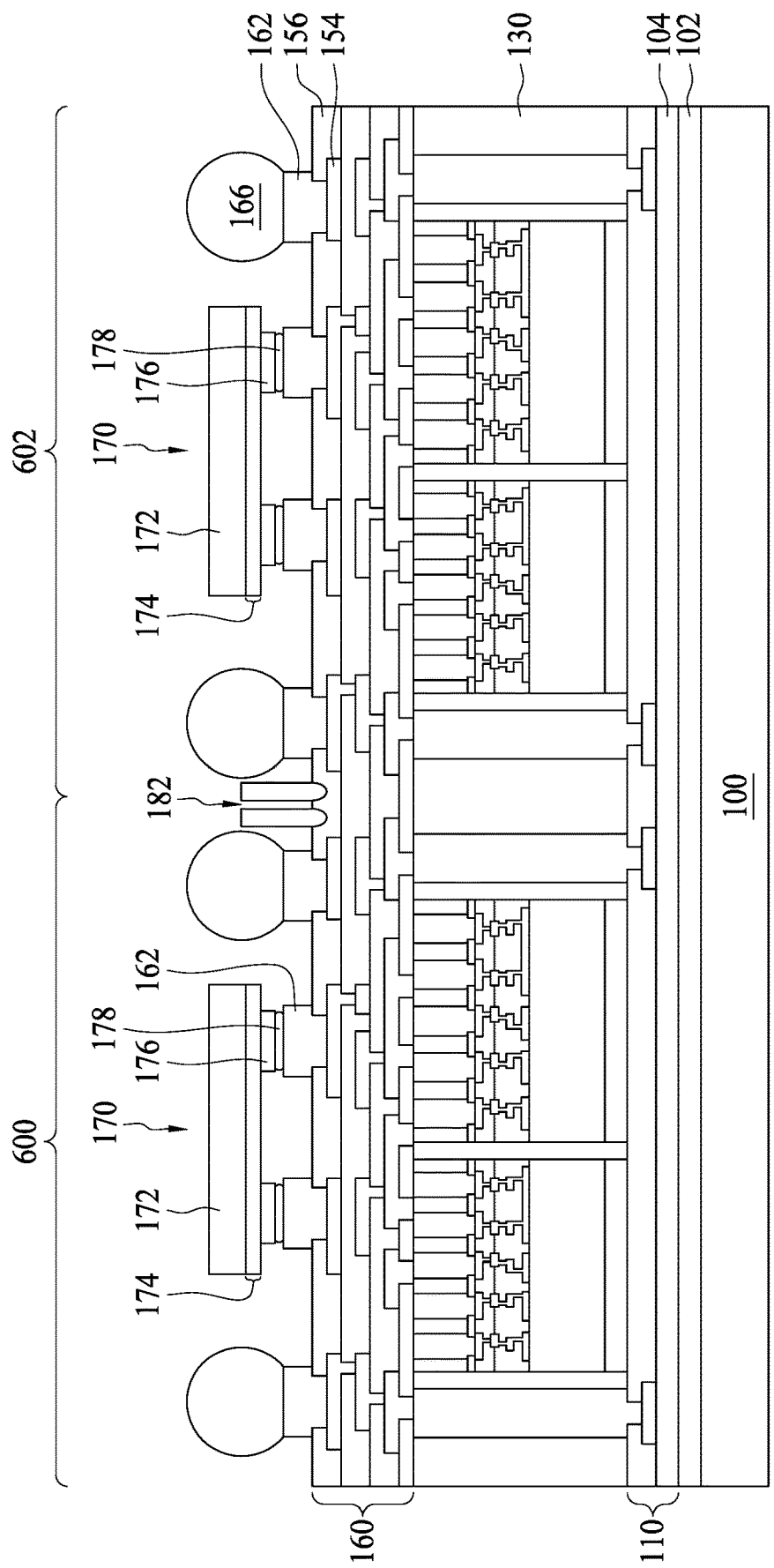
Figure 20:
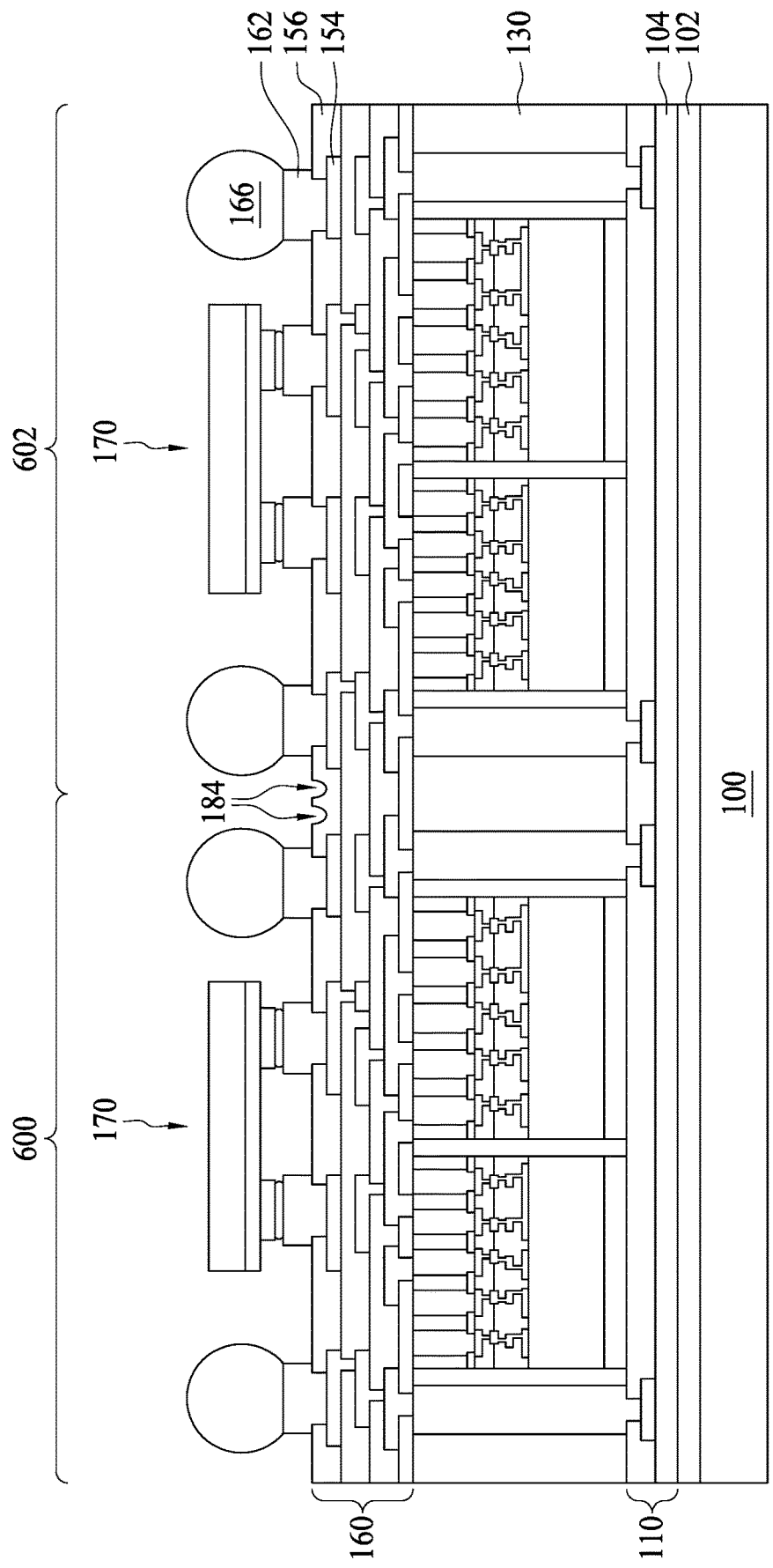

FIGS. 19 and 20 illustrate a pre-cut process for the singulation process of the package structure. A cutting apparatus 182 partially cuts into the redistribution structure 160 in a scribe line area between the first region 600 and the second region 602 to form recesses 184 in the redistribution structure 160. In some embodiments, the cutting apparatus 182 for the pre-cut process is a laser. The pre-cut process may prevent delamination of the redistribution structure and its layers during the subsequent singulation process (see, e.g., FIG. 24).

Figure 21:
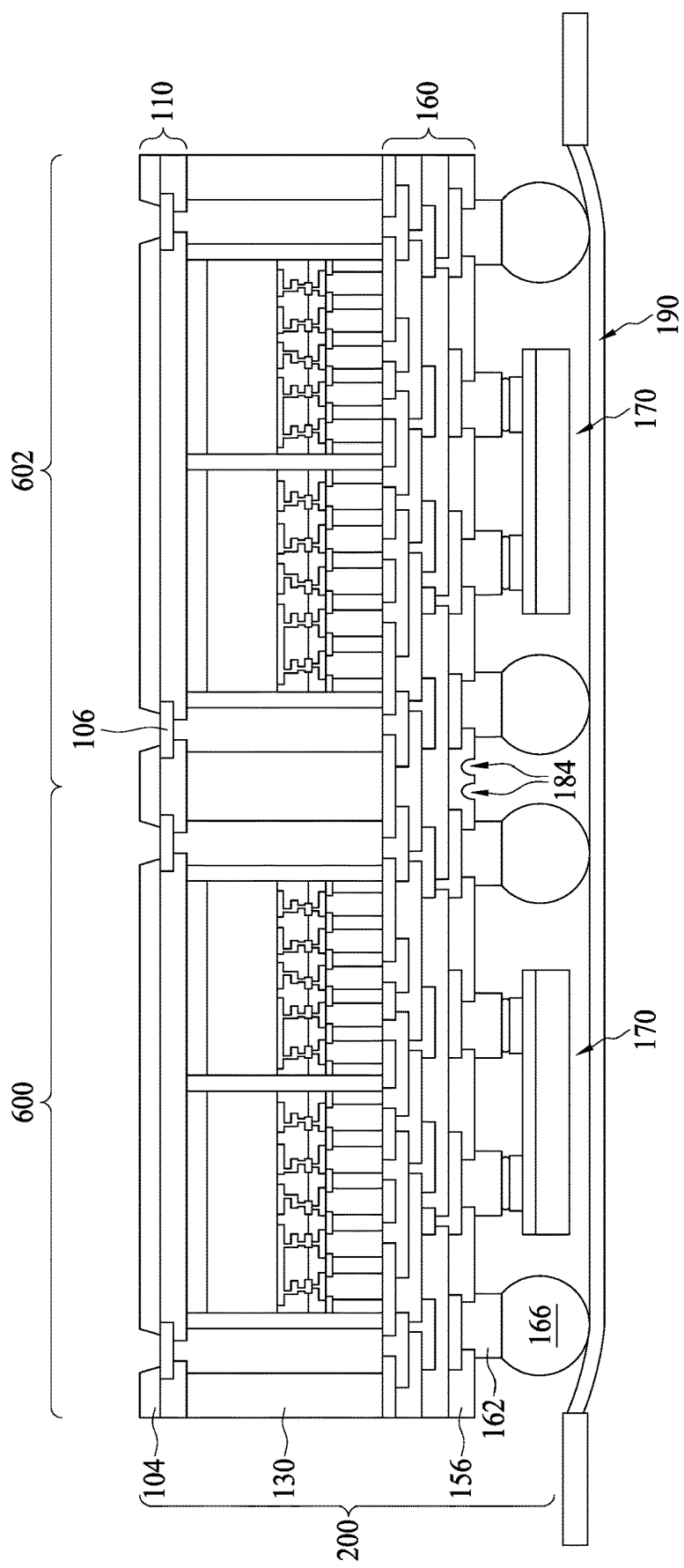

In FIG. 21, a carrier substrate de-bonding is performed to detach (de-bond) the carrier substrate 100 from the backside redistribution structure, e.g., dielectric layer 104. In accordance with some embodiments, the de-bonding includes projecting a light such as a laser light or an UV light on the release layer 102 so that the release layer 102 decomposes under the heat of the light and the carrier substrate 100 can be removed. The structure is then flipped over and placed on a tape 190.

As further illustrated in FIG. 21, openings are formed through the dielectric layer 104 to expose portions of the metallization pattern 106. The openings may be formed, for example, using laser drilling, etching, or the like.

Figure 22:
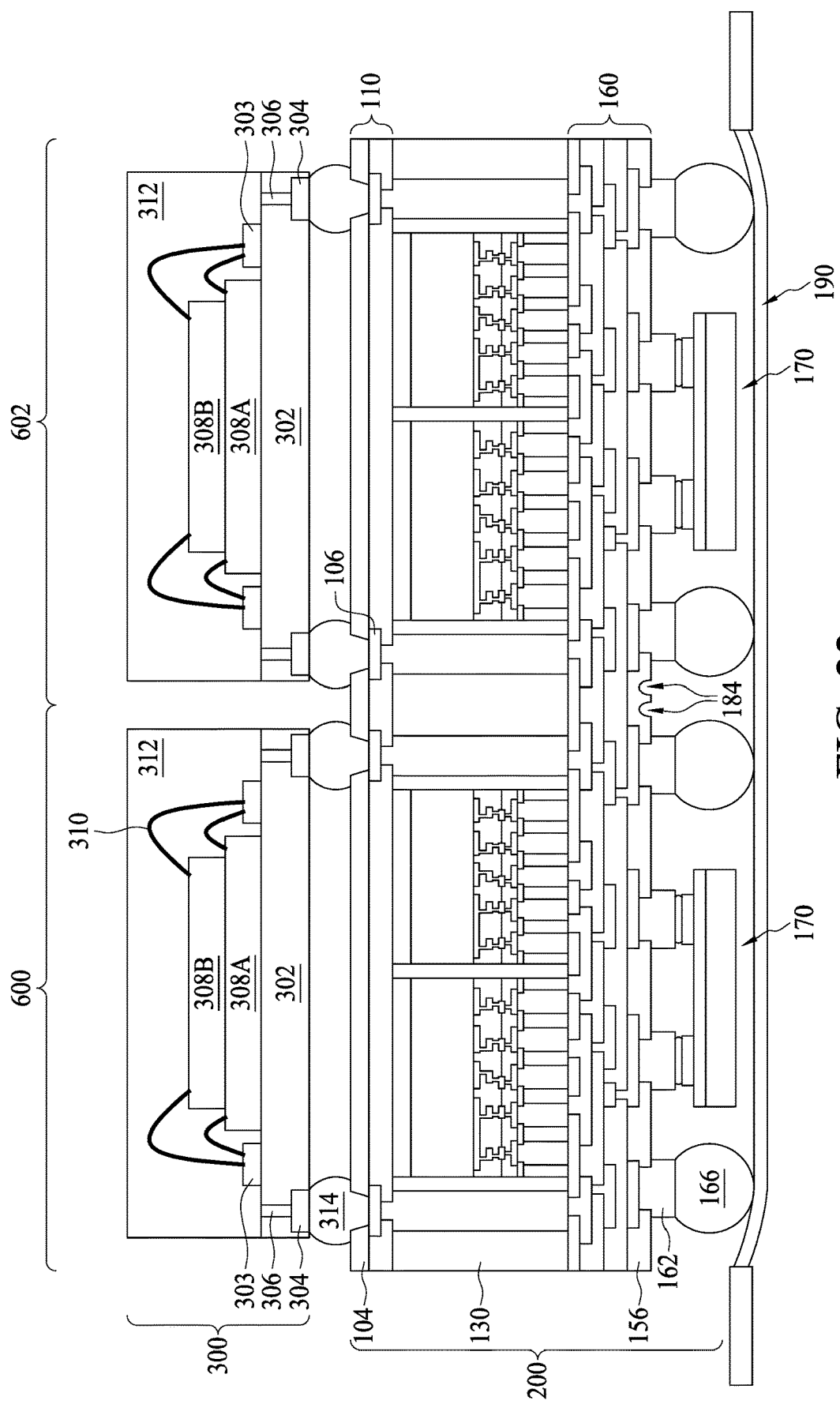

In FIG. 22, second packages 300 are bonded to the formed first packages 200 using conductive connectors 314 extending through the openings in the dielectric layer 104. The bonding between the second package 300 and the first package 200 may be a solder bonding or a direct metal-to-metal (such as a copper-to-copper or tin-to-tin) bonding. In an embodiment, the second package 300 is bonded to the first package 200 by a reflow process. During this reflow process, the conductive connectors 314 are in contact with the bond pads 304 and the metallization patterns 106 to physically and electrically couple the second package 300 to the first package 200. After the bonding process, an IMC (not shown) may form at the interface of the metallization patterns 106 and the conductive connectors 314 and also at the interface between the conductive connectors 314 and the bond pads 304 (not shown).

Before being bonded to the first packages 200, the second packages 300 may be processed according to applicable manufacturing processes to form second packages 300. For example, the second packages 300 each include a substrate 302 and one or more stacked dies 308 (308A and 308B) coupled to the substrate 302. The substrate 302 may be made of a semiconductor material such as silicon, germanium, diamond, or the like. In some embodiments, compound materials such as silicon germanium, silicon carbide, gallium arsenic, indium arsenide, indium phosphide, silicon germanium carbide, gallium arsenic phosphide, gallium indium phosphide, combinations of these, and the like, may also be used. Additionally, the substrate 302 may be a SOI substrate. Generally, an SOI substrate includes a layer of a semiconductor material such as epitaxial silicon, germanium, silicon germanium, SOI, silicon germanium on insulator (SGOI), or combinations thereof. The substrate 302 is, in one alternative embodiment, based on an insulating core such as a fiberglass reinforced resin core. One example core material is fiberglass resin such as FR4. Alternatives for the core material include bismaleimide-triazine (BT) resin, or alternatively, other printed circuit board (PCB) materials or films. Build up films such as Ajinomoto build-up film (ABF) or other laminates may be used for substrate 302.

The substrate 302 may include active and passive devices (not shown). As one of ordinary skill in the art will recognize, a wide variety of devices such as transistors, capacitors, resistors, combinations of these, and the like may be used to generate the structural and functional requirements of the design for the semiconductor package 300. The devices may be formed using any suitable methods.

The substrate 302 may also include metallization layers (not shown) and through vias 306. The metallization layers may be formed over the active and passive devices and are designed to connect the various devices to form functional circuitry. The metallization layers may be formed of alternating layers of dielectric (e.g., low-k dielectric material) and conductive material (e.g., copper) with vias interconnecting the layers of conductive material and may be formed through any suitable process (such as deposition, damascene, dual damascene, or the like). In some embodiments, the substrate 302 is substantially free of active and passive devices.

The substrate 302 may have bond pads 303 on a first side of the substrate 302 to couple to the stacked dies 308, and bond pads 304 on a second side of the substrate 302, the second side being opposite the first side of the substrate 302, to couple to the conductive connectors 314. In some embodiments, the bond pads 303 and 304 are formed by forming recesses (not shown) into dielectric layers (not shown) on the first and second sides of the substrate 302. The recesses may be formed to allow the bond pads 303 and 304 to be embedded into the dielectric layers. In other embodiments, the recesses are omitted as the bond pads 303 and 304 may be formed on the dielectric layer. In some embodiments, the bond pads 303 and 304 include a thin seed layer (not shown) made of copper, titanium, nickel, gold, palladium, the like, or a combination thereof. The conductive material of the bond pads 303 and 304 may be deposited over the thin seed layer. The conductive material may be formed by an electrochemical plating process, an electroless plating process, CVD, ALD, PVD, the like, or a combination thereof. In an embodiment, the conductive material of the bond pads 303 and 304 is copper, tungsten, aluminum, silver, gold, the like, or a combination thereof.

In an embodiment, the bond pads 303 and 304 are UBMs that include three layers of conductive materials, such as a layer of titanium, a layer of copper, and a layer of nickel. However, one of ordinary skill in the art will recognize that there are many suitable arrangements of materials and layers, such as an arrangement of chrome/chrome-copper alloy/copper/gold, an arrangement of titanium/titanium tungsten/copper, or an arrangement of copper/nickel/gold, that are suitable for the formation of the UBMs 303 and 304. Any suitable materials or layers of material that may be used for the UBMs 303 and 304 are fully intended to be included within the scope of the current application. In some embodiments, the through vias 306 extend through the substrate 302 and couple at least one bond pad 303 to at least one bond pad 304.

In the illustrated embodiment, the stacked dies 308 are coupled to the substrate 302 by wire bonds 310, although other connections may be used, such as conductive bumps. In an embodiment, the stacked dies 308 are stacked memory dies. For example, the stacked memory dies 308 may include low-power (LP) double data rate (DDR) memory modules, such as LPDDR1, LPDDR2, LPDDR3, LPDDR4, or the like memory modules.

In some embodiments, the stacked dies 308 and the wire bonds 310 may be encapsulated by a molding material 312. The molding material 312 may be molded on the stacked dies 308 and the wire bonds 310, for example, using compression molding. In some embodiments, the molding material 312 is a molding compound, a polymer, an epoxy, silicon oxide filler material, the like, or a combination thereof. A curing step may be performed to cure the molding material 312, wherein the curing may be a thermal curing, a UV curing, the like, or a combination thereof.

In some embodiments, the stacked dies 308 and the wire bonds 310 are buried in the molding material 312, and after the curing of the molding material 312, a planarization step, such as a grinding, is performed to remove excess portions of the molding material 312 and provide a substantially planar surface for the second packages 300.

After the second packages 300 are formed, the packages 300 are bonded to the first packages 200 by way of conductive connectors 314, the bond pads 304, and the metallization pattern 106. In some embodiments, the stacked memory dies 308 may be coupled to the integrated circuit dies 114 through the wire bonds 310, the bond pads 303 and 304, through vias 306, the conductive connectors 314, and the through vias 112.

The conductive connectors 314 may be similar to the conductive connectors 166 described above and the description is not repeated herein, although the conductive connectors 314 and 166 need not be the same. In some embodiments, before bonding the conductive connectors 314, the conductive connectors 314 are coated with a flux (not shown), such as a no-clean flux. The conductive connectors 314 may be dipped in the flux or the flux may be jetted onto the conductive connectors 314. In another embodiment, the flux may be applied to the surfaces of the metallization patterns 106.

In some embodiments, the conductive connectors 314 may have an epoxy flux (not shown) formed thereon before they are reflowed with at least some of the epoxy portion of the epoxy flux remaining after the second package 300 is attached to the first package 200.

Figure 23:
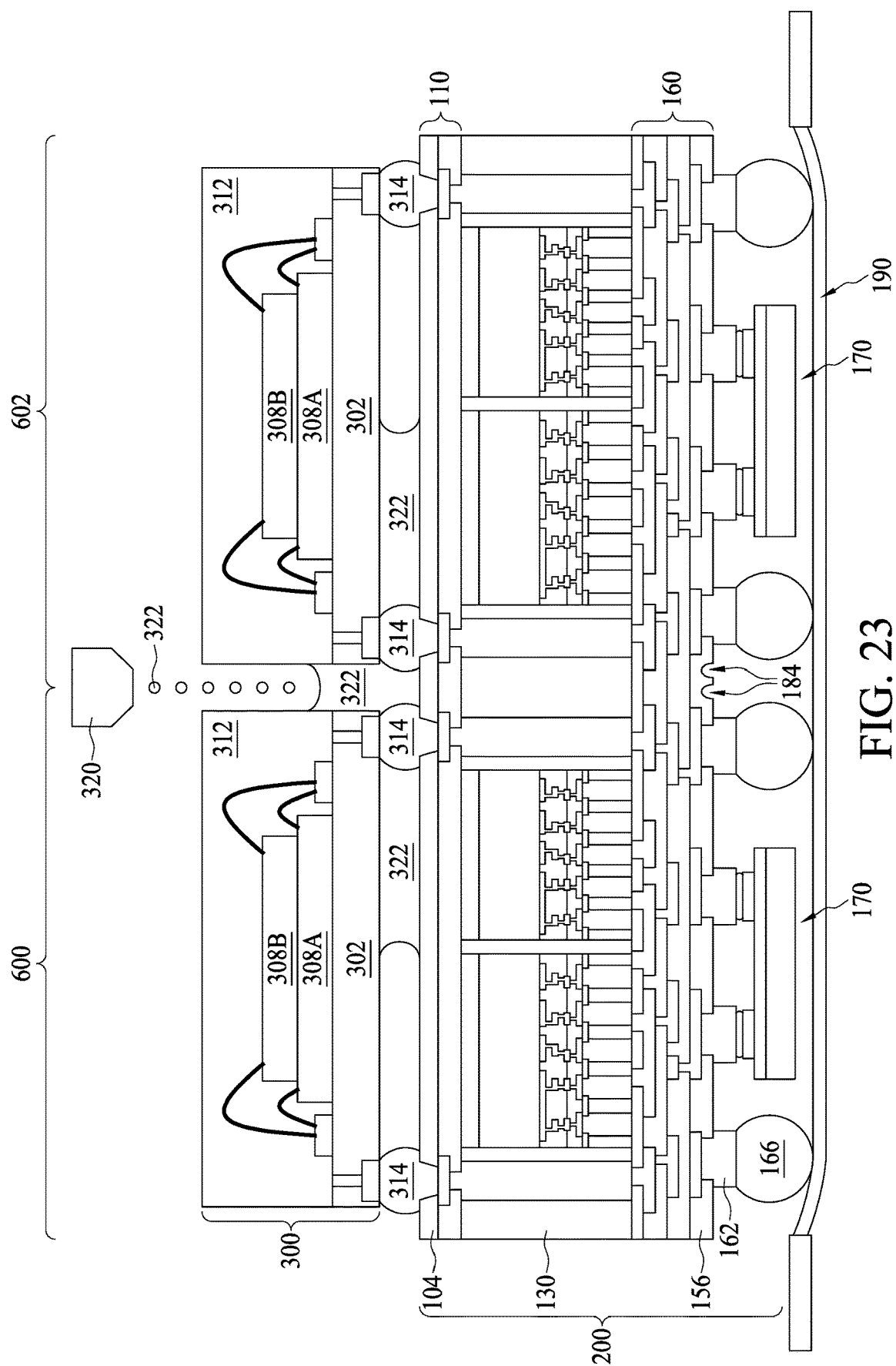

FIG. 23 illustrates the dispensing of an underfill 322 between the first packages 200 and second packages 300. The underfill 322 materials might be epoxy or polymer with filler or flux. The underfill 322 is dispensed with a jet head 320 and is dispensed between adjacent second packages 300 to flow between the first packages 200 and the second packages 300 and surrounding the conductive connectors 314. As illustrated in FIG. 23, one dispensing point of the underfill 322 in a scribe line region can form the underfill 322 between the first packages 200 and the second packages in both of the regions 600 and 602. This increases the throughput of the underfill process. The underfill 322 can be formed by a deposition or printing method, but any suitable process would be applicable. In some embodiments, the underfill 322 can flow between the first packages 200 and the second packages 300 by a capillary flow process. In some embodiments, the underfill can be dispensed/injected in a chamber or oven at a higher pressure than ambient atmospheric pressure.

Figure 24:
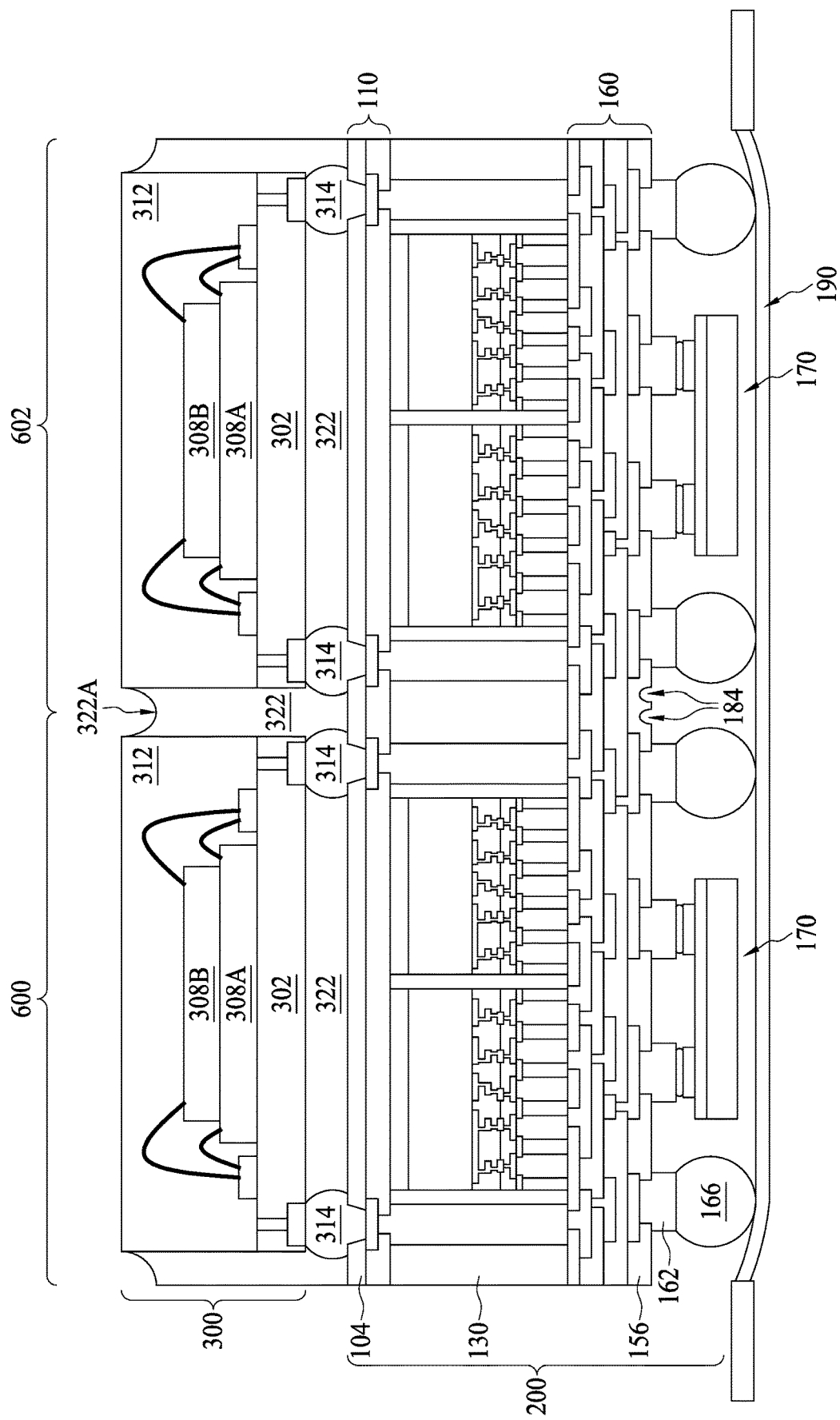

In FIG. 24, the underfill 322 is formed between the first packages 200 and the second packages 300 in both regions 600 and 602 and also extends up along sidewalls of the second packages 300. This full coverage underfill process can be achieved by adding excess underfill 322 during the dispensing step and by curing the underfill in a higher pressure environment.

After dispensing, the underfill 322 is cured in a curing operation. The curing operation can be performed in a chamber or oven at a higher pressure than ambient atmospheric pressure. In some embodiments, the pressure of the chamber during the underfill curing process is in a range from about 3 kg/cm$^2$ to about 20 kg/cm$^2$. The higher pressure during the curing process can accelerate the movement of voids in the underfill 322, which can improve and increase the flowing speed of the underfill 322 (e.g. speed at which the underfill 322 flows between first packages 200 and the second packages 300). After the curing operation, a top surface 322A of the underfill 322 can be curved. In some embodiments, the curved top surface 322A is a concave surface. In some embodiments, due to the excess underfill 322 dispensed, the underfill 322 can extend to the top surface (and sometimes extend along some of the top surface) of the second package 300.

Figure 25:
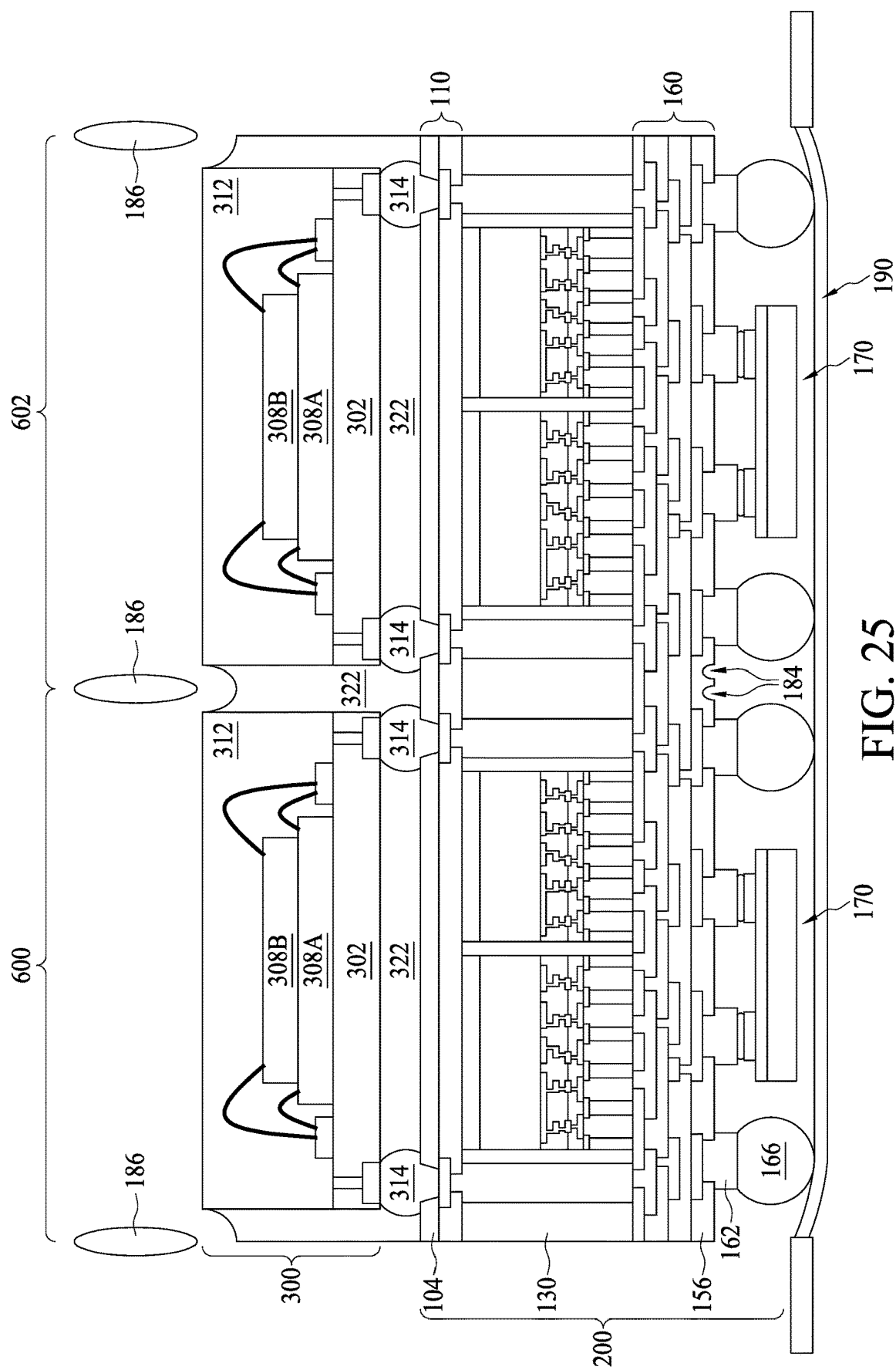

In FIG. 25, a singulation process is performed by singulating 186 along scribe line regions e.g., between adjacent regions 600 and 602. In some embodiments, the singulating 186 includes a sawing process, a laser process, or a combination thereof. The singulating 186 singulates the first package region 600 from the second package region 602 and from other adjacent regions (not shown).

Figure 26:
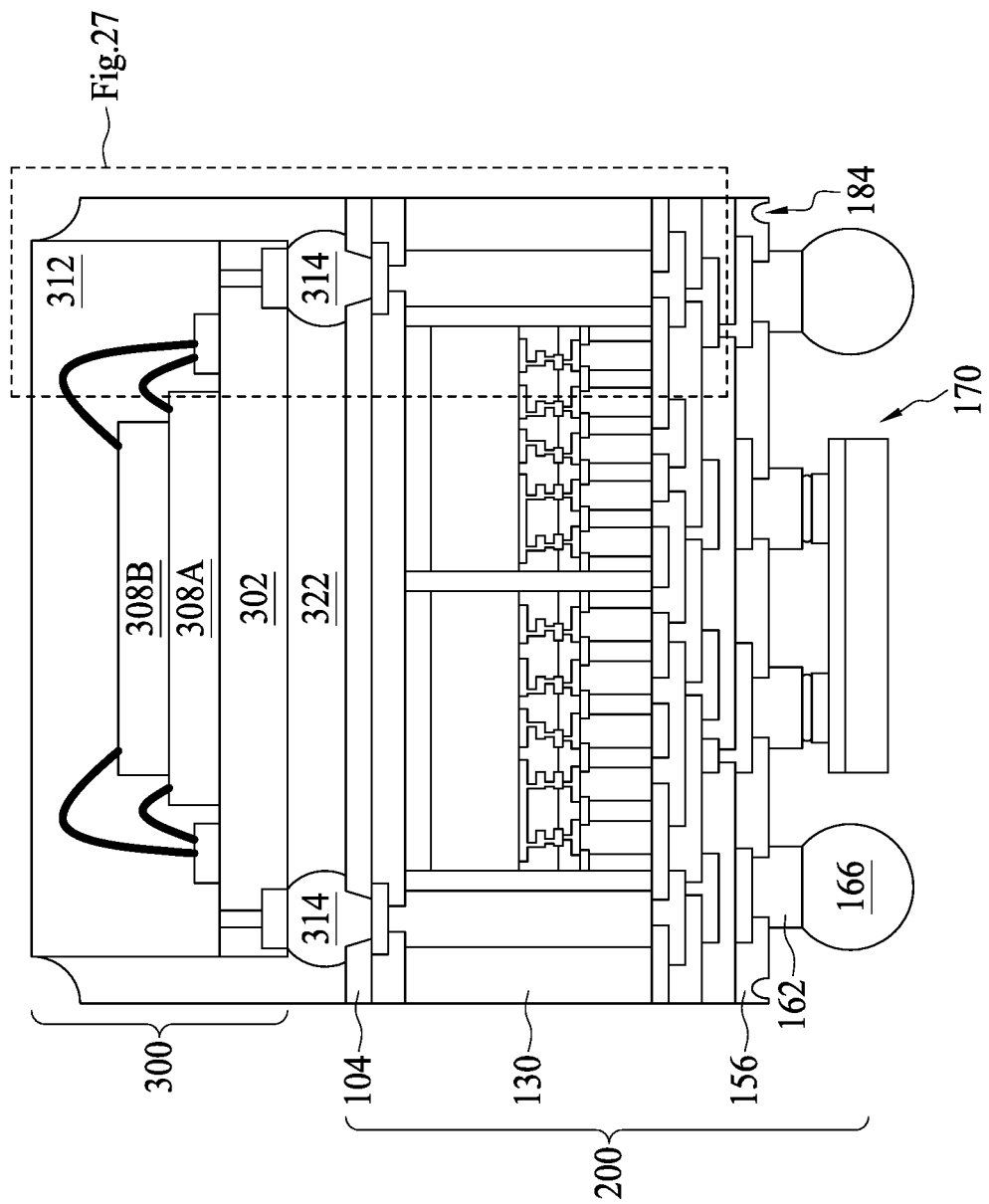

FIG. 26 illustrates a resulting, singulated package structure including a first package 200 and a second package 300, which may be from one of the first package region 600 or the second package region 602. The package 200 may also be referred to as an integrated fan-out (InFO) package 200.

Figure 27:
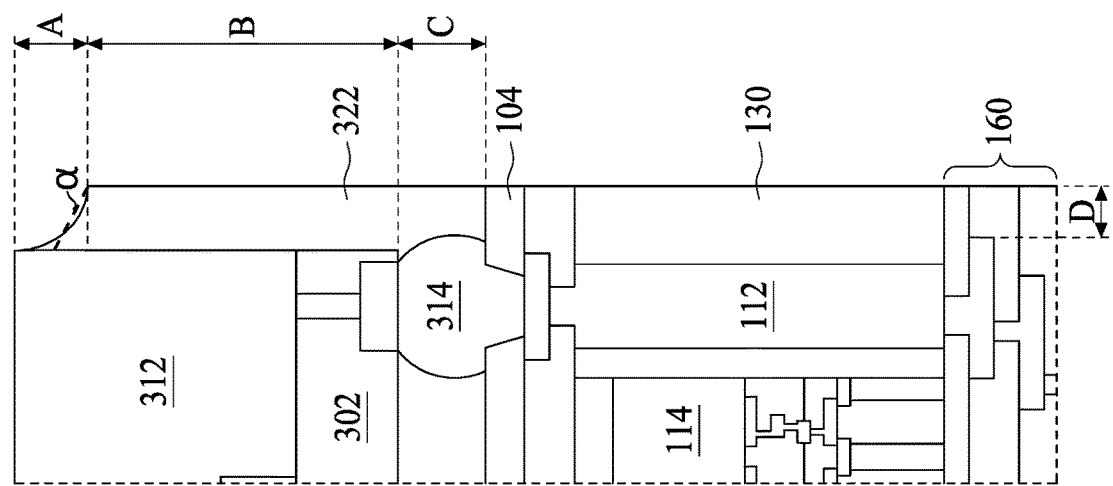

FIG. 27 illustrates a detailed view of a portion of the package structure shown in FIG. 26. In particular, FIG. 27 illustrates a detailed view of the sidewall of the underfill 322 after the singulation process. The underfill 322 has a portion with a curved sidewall (previous curved top surface 322A that was singulated) and a portion with a substantially planar portion. In some embodiments, the curved sidewall is a concave surface.

A transition point of the curved portion to the planar portion is a distance A from the top of the second package 300 (e.g. top of molding material 312) measured in a direction perpendicular to a major surface of the substrate 302. In some embodiments, the distance A is in a range from about 100 μm to about 150 μm.

The planar portion has a height of distances B+C as illustrated in FIG. 27. The distance B is measured from the bottom of second package 300 (e.g. bottom of substrate 302) to the transition point in a direction perpendicular to a major surface of the substrate 302. In some embodiments, the distance B is in a range from about 300 μm to about 400 μm.

The distance C is the gap height between the first package 200 and the second package 300 as measured in a direction perpendicular to a major surface of the substrate 302. In some embodiments, the distance C is in a range from about 50 μm to about 150 μm. In some embodiments, a ratio of C/(B+C) is in a range from about 0.14 to about 0.27.

A thickness of the underfill 322 on the sidewalls of the second package 300 is shown by a distance D in FIG. 27. The distance D may be measured from a sidewall of the second package 300 (e.g. sidewall of molding material 312) to an outer bound of a seal ring (not shown in FIG. 27) in the redistribution structure 160. In some embodiments, the distance D is in a range from about 50 μm to about 100 μm.

The angle of the curved surface of the underfill 322 at the transition point of the curved surface to the planar surface is shown as angle α in FIG. 27. In some embodiments, the angle α is in a range from about 30 degrees and 80 degrees.

Figure 28:
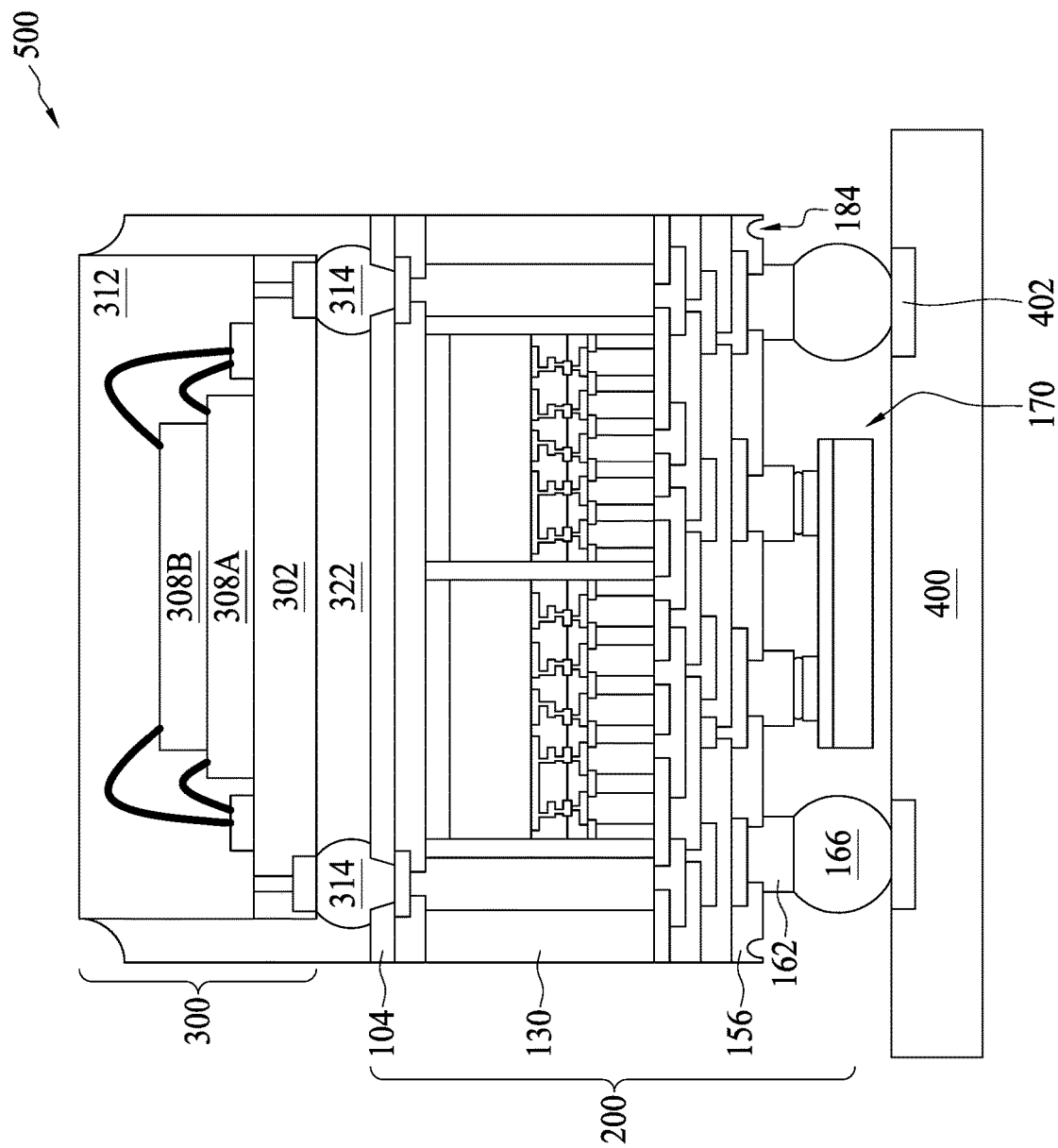

FIG. 28 illustrates a package structure 500 including the first package 200, the second package 300, and a substrate 400. The semiconductor package 500 includes the packages 200 and 300 being mounted to a substrate 400. The substrate 400 may be referred to a package substrate 400. The package 200 is mounted to the package substrate 400 using the conductive connectors 166. With the package 200 mounted to the substrate 400, the IPD component(s) 170 are interposed between the redistribution structure 160 of the package 200 and the substrate 400.

The package substrate 400 may be made of a semiconductor material such as silicon, germanium, diamond, or the like. Alternatively, compound materials such as silicon germanium, silicon carbide, gallium arsenic, indium arsenide, indium phosphide, silicon germanium carbide, gallium arsenic phosphide, gallium indium phosphide, combinations of these, and the like, may also be used. Additionally, the package substrate 400 may be a SOI substrate. Generally, an SOI substrate includes a layer of a semiconductor material such as epitaxial silicon, germanium, silicon germanium, SOI, SGOI, or combinations thereof. The package substrate 400 is, in one alternative embodiment, based on an insulating core such as a fiberglass reinforced resin core. One example core material is fiberglass resin such as FR4. Alternatives for the core material include bismaleimide-triazine BT resin, or alternatively, other PCB materials or films. Build up films such as ABF or other laminates may be used for package substrate 400.

The package substrate 400 may include active and passive devices (not shown in FIG. 22). As one of ordinary skill in the art will recognize, a wide variety of devices such as transistors, capacitors, resistors, combinations of these, and the like may be used to generate the structural and functional requirements of the design for the semiconductor package 500. The devices may be formed using any suitable methods.

The package substrate 400 may also include metallization layers and vias (not shown) and bond pads 402 over the metallization layers and vias. The metallization layers may be formed over the active and passive devices and are designed to connect the various devices to form functional circuitry. The metallization layers may be formed of alternating layers of dielectric (e.g., low-k dielectric material)

and conductive material (e.g., copper) with vias interconnecting the layers of conductive material and may be formed through any suitable process (such as deposition, damascene, dual damascene, or the like). In some embodiments, the package substrate 400 is substantially free of active and passive devices.

In some embodiments, the conductive connectors 166 can be reflowed to attach the package 200 to the bond pads 402. The conductive connectors 166 electrically and/or physically couple the substrate 400, including metallization layers in the substrate 400, to the first package 200.

The conductive connectors 166 may have an epoxy flux (not shown) formed thereon before they are reflowed with at least some of the epoxy portion of the epoxy flux remaining after the package 200 is attached to the substrate 400. This remaining epoxy portion may act as an underfill to reduce stress and protect the joints resulting from the reflowing the conductive connectors 166. In some embodiments, an underfill (not shown) may be formed between the first package 200 and the substrate 400 and surrounding the conductive connectors 166 and the IPD component 170. The underfill may be formed by a capillary flow process after the package 200 is attached or may be formed by a suitable deposition method before the package 200 is attached.

Embodiments of the present disclosure include a package structure including a full coverage underfill process that improves the protection of the sidewalls of the package that improves reliability and yield of the package structure. The disclosed full coverage underfill process also has increased underfill flowing speed and can simplify the package singulation process. The underfill may be cured under a higher pressure than other underfill processes. This increase in pressure may accelerate the movement of voids in the underfill during the curing process.

An embodiment is a structure including a first package including a first die, and a molding compound at least laterally encapsulating the first die, a second package bonded to the first package with a first set of conductive connectors, the second package comprising a second die, and an underfill between the first package and the second package and surrounding the first set of conductive connectors, the underfill having a first portion extending up along a sidewall of the second package, the first portion having a first sidewall, the first sidewall having a curved portion and a planar portion.

Another embodiment is a method including forming a plurality of first packages, each of the plurality of first packages comprising a first die surrounded by a molding compound and a redistribution structure overlying a first side of the first die and the molding compound, the redistribution structure comprising metallization patterns, coupling a first set of conductive connectors comprising under bump metallizations to a first metallization pattern of the redistribution structure, bonding a plurality of second packages to the plurality of first packages using a second set of conductive connectors, the second package being proximate a second side of the first die, the second side being opposite the first side, and dispensing underfill in scribe line regions between adjacent second packages and between the first packages and the second packages and surrounding the second set of conductive connectors, the underfill extending up along sidewalls of the plurality of second packages, the underfill having curved, concave top surfaces between the adjacent second packages.

A further embodiment is a method including forming a plurality of first packages, forming each of the first packages including forming an electrical connector over a carrier substrate, attaching a first die to the carrier substrate, the electrical connector extending from a second side of the first die to a first side of the first die, the second side being opposite the first side, encapsulating the first die and the electrical connector with a molding compound, the electrical connector extending through the molding compound, forming a redistribution structure overlying the first side of the first die and the molding compound, coupling a first set of conductive connectors to the redistribution structure, bonding a passive component to the redistribution structure adjacent the first set of conductive connectors, and removing the carrier substrate. The method further including bonding a plurality of second packages to the plurality of first packages using a second set of conductive connectors, the second package being proximate the second side of the first die, dispensing underfill between the first packages and the second packages and surrounding the second set of conductive connectors, the underfill extending up along sidewalls of the plurality of second packages, the underfill having concave top surfaces between adjacent second packages, and singulating the plurality of first packages to form package structures, the singulating cutting through the underfill at the concave top surfaces to form a sidewall of underfill having a concave portion and a planar portion.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming a plurality of first packages, each of the plurality of first packages comprising a first die surrounded by a molding compound and a redistribution structure overlying a first side of the first die and the molding compound, the redistribution structure comprising metallization patterns;
   coupling a first set of conductive connectors comprising under bump metallizations to a first metallization pattern of the redistribution structure;
   bonding a plurality of second packages to the plurality of first packages using a second set of conductive connectors, the second package being proximate a second side of the first die, the second side being opposite the first side;
   dispensing an underfill in scribe line regions between adjacent second packages and between the first packages and the second packages and surrounding the second set of conductive connectors, the underfill extending up along sidewalls of the plurality of second packages, the underfill having curved, concave top surfaces between the adjacent second packages; and
   singulating the plurality of first and second packages to form package structures, the singulating cutting through the underfill at the curved, concave top surfaces to form a sidewall of underfill having a curved, concave portion and a planar portion, wherein singulating the plurality of first and second packages to form package structures comprises:

before bonding the plurality of second packages to the plurality of first packages, pre-cutting the plurality of first packages by partially cutting into the redistribution structure; and after bonding the plurality of second packages to the plurality of first packages and forming the underfill, cutting through the underfill and the plurality of first packages to form the package structures.

2. The method of claim 1, wherein pre-cutting the plurality of first packages comprises uses a laser, and wherein cutting through the underfill and the plurality of first packages uses a die saw.

3. The method of claim 1, wherein the planar portion of the sidewall of the underfill is interposed between the curved, concave portion of the sidewall and the first package.

4. The method of claim 1 further comprising:
bonding an integrated passive device component to an under bump metallization on a first metallization pattern of the redistribution structure, the integrated passive device component being adjacent the first set of conductive connectors; and
bonding the package structures to a substrate using the first set of conductive connectors, the integrated passive device component is interposed between the substrate and the redistribution structure of the first package.

5. The method of claim 1 further comprising
curing the underfill at a pressure higher than ambient atmospheric pressure.

6. The method of claim 1, wherein forming each of the plurality of first packages comprises:
forming an electrical connector over a carrier substrate;
attaching the first die to the carrier substrate, the electrical connector extending from a second side of the first die to the first side of the first die, the electrical connector being adjacent the first die;
encapsulating the first die and the electrical connector with the molding compound; and
forming the redistribution structure overlying the first side of the first die and the molding compound.

7. The method of claim 1, wherein the underfill extends to a top surface of the second package.

8. A method comprising:
forming a plurality of first packages, forming each of the first packages comprising:
forming an electrical connector over a carrier substrate;
attaching a first die to the carrier substrate, the electrical connector extending from a second side of the first die to a first side of the first die, the second side being opposite the first side;
encapsulating the first die and the electrical connector with a molding compound, the electrical connector extending through the molding compound;
forming a redistribution structure overlying the first side of the first die and the molding compound;
coupling a first set of conductive connectors to the redistribution structure;
bonding a passive component to the redistribution structure adjacent the first set of conductive connectors; and
removing the carrier substrate;
bonding a plurality of second packages to the plurality of first packages using a second set of conductive connectors, the second package being proximate the second side of the first die;

dispensing underfill between the first packages and the second packages and surrounding the second set of conductive connectors, the underfill extending up along sidewalls of the plurality of second packages, the underfill having concave top surfaces between adjacent second packages; and
singulating the plurality of first and second packages to form package structures, the singulating cutting through the underfill at the concave top surfaces to form a sidewall of underfill having a concave portion and a planar portion.

9. The method of claim 8, wherein the planar portion of the sidewall of the underfill is interposed between the concave portion of the sidewall and the first package.

10. The method of claim 8, wherein the underfill extends to a top surface of the second package.

11. The method of claim 8, wherein singulating the plurality of first and second packages to form package structures comprises:
before bonding the plurality of second packages to the plurality of first packages, pre-cutting the plurality of first packages by partially cutting into the redistribution structure; and
after bonding the plurality of second packages to the plurality of first packages and dispensing the underfill, cutting through the underfill and the plurality of first packages to form the package structures.

12. The method of claim 8 further comprising:
bonding an integrated passive device component to a metallization pattern of the redistribution structure, the integrated passive device component being adjacent the first set of conductive connectors; and
bonding the first package to a substrate using the first set of conductive connectors, the integrated passive device component is interposed between the substrate and the redistribution structure of the first package.

13. A method comprising:
forming a plurality of first packages, each of the plurality of first packages comprising a first die surrounded by a molding compound and a redistribution structure overlying a first side of the first die and the molding compound, the redistribution structure comprising metallization patterns;
bonding a plurality of second packages to the plurality of first packages using a first set of conductive connectors, the second package being proximate a second side of the first die, the second side being opposite the first side; and
dispensing an underfill in scribe line regions between adjacent second packages and between the first packages and the second packages, the underfill extending up along sidewalls of the plurality of second packages;
curing the underfill at a pressure higher than ambient atmospheric pressure; and
singulating the plurality of first and second packages to form package structures, wherein singulating the plurality of first and second packages to form package structures comprises:
before bonding the plurality of second packages to the plurality of first packages, pre-cutting the plurality of first packages by partially cutting into the redistribution structure; and
after bonding the plurality of second packages to the plurality of first packages and forming the underfill, cutting through the underfill and the plurality of first packages to form the package structures.

14. The method of claim 13, further comprising:
coupling a first set of conductive connectors comprising under bump metallizations to a first metallization pattern of the redistribution structure.

15. The method of claim 13, wherein the singulating through the underfill forms a sidewall of the underfill having a curved, concave portion and a planar portion.

16. The method of claim 15, wherein the planar portion of the sidewall of the underfill is interposed between the curved, concave portion of the sidewall and the first package.

17. The method of claim 15 further comprising:
bonding an integrated passive device component to a metallization pattern of the redistribution structure, the integrated passive device component being adjacent the first set of conductive connectors; and
bonding the package structures to a substrate using the first set of conductive connectors, the integrated passive device component is interposed between the substrate and the redistribution structure of the first package.

18. The method of claim 13, wherein pre-cutting the plurality of first packages comprises uses a laser, and wherein cutting through the underfill and the plurality of first packages uses a die saw.

19. The method of claim 13, wherein each of the plurality of first packages further comprise a through via extending through the molding compound adjacent the first die, at least some of the metallization patterns of the redistribution structure being electrically coupled to the through via.

* * * * *